(12) United States Patent
Ishino

(10) Patent No.: US 11,380,656 B2
(45) Date of Patent: Jul. 5, 2022

(54) SEMICONDUCTOR DEVICE

(71) Applicant: DENSO CORPORATION, Kariya (JP)

(72) Inventor: Hiroshi Ishino, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/093,777

(22) Filed: Nov. 10, 2020

(65) Prior Publication Data

US 2021/0057389 A1 Feb. 25, 2021

Related U.S. Application Data

(63) Continuation of application No. PCT/JP2019/013599, filed on Mar. 28, 2019.

(30) Foreign Application Priority Data

May 28, 2018 (JP) .............................. JP2018-101717

(51) Int. Cl.
  *H01L 25/07* (2006.01)
  *H01L 23/367* (2006.01)
  (Continued)

(52) U.S. Cl.
  CPC ........ *H01L 25/072* (2013.01); *H01L 23/3675* (2013.01); *H01L 24/32* (2013.01); *H01L 24/48* (2013.01); *H01L 2224/32245* (2013.01); *H01L 2224/48175* (2013.01); *H01L 2924/1033* (2013.01); *H01L 2924/10253* (2013.01); *H01L 2924/10272* (2013.01);
  (Continued)

(58) Field of Classification Search
  CPC ... H01L 25/072; H01L 23/3675; H01L 24/32; H01L 24/48; H01L 224/32245
  See application file for complete search history.

(56) References Cited

U.S. PATENT DOCUMENTS

2007/0216013 A1* 9/2007 Funakoshi .............. H01L 24/40
  257/691
2016/0315037 A1 10/2016 Kadoguchi et al.
(Continued)

FOREIGN PATENT DOCUMENTS

JP 2003-303939 A 10/2003
JP 2006-036939 A 2/2006
(Continued)

*Primary Examiner* — Marc Anthony Armand
(74) *Attorney, Agent, or Firm* — Posz Law Group, PLC

(57) ABSTRACT

The semiconductor device includes a semiconductor element, a first conductive member, a second conductive member, an insulating member, a first main terminal, and a second main terminal. The first main terminal and the second main terminal, respectively, extend from the first conductive member and the second conductive member. The first main terminal and the second main terminal, respectively, have a first projecting portion and a second projecting portion projecting outside of the insulating member. The first projecting portion and the second projecting portion, respectively, have a first facing portion and a second facing portion at which plate surfaces of the first and second projecting portions face each other across a gap, and a first non-facing portion and a second non-facing portion at which the plate surfaces of the first and second projecting portions do not face each other.

14 Claims, 14 Drawing Sheets

(51) Int. Cl.
    *H01L 23/00*       (2006.01)
    *H02P 27/06*       (2006.01)

(52) U.S. Cl.
    CPC ............ *H01L 2924/13055* (2013.01); *H01L 2924/14252* (2013.01); *H01L 2924/30107* (2013.01); *H02P 27/06* (2013.01)

(56) References Cited

U.S. PATENT DOCUMENTS

| | | | |
|---|---|---|---|
| 2017/0148770 A1* | 5/2017 | Ishino | H01L 23/492 |
| 2018/0022220 A1* | 1/2018 | Xu | H05K 1/145 |
| | | | 307/10.1 |
| 2019/0139874 A1 | 5/2019 | Kadoguchi et al. | |

FOREIGN PATENT DOCUMENTS

| | | |
|---|---|---|
| JP | 2012-149194 A | 8/2012 |
| JP | 2015-082614 A | 4/2015 |
| JP | 6181136 B2 | 8/2017 |

\* cited by examiner

US 11,380,656 B2

SEMICONDUCTOR DEVICE

CROSS REFERENCE TO RELATED APPLICATIONS

The present application is a continuation application of International Patent Application No. PCT/JP2019/013599 filed on Mar. 28, 2019, which designated the U.S. and claims the benefit of priority from Japanese Patent Application No. 2018-101717 filed on May 28, 2018. The entire disclosures of all of the above applications are incorporated herein by reference.

TECHNICAL FIELD

The present disclosure relates to a semiconductor device.

BACKGROUND

A semiconductor device includes a semiconductor element having main electrodes on opposite surfaces, conductive members, a sealing resin body, and main terminals. The semiconductor device includes a first conductive member and a second conductive member, as the conductive members, disposed on opposite sides of the semiconductor element. The sealing resin body seals the semiconductor element and a part of each of the conductive members. The main terminals connect to the conductive members, and project outward from one lateral surface of the sealing resin body. The main terminals include a first main terminal and a second main terminal. The first main terminal extends from the first conductive member, and the second main terminal extends from the second conductive member in the same direction as the first main terminal. When the semiconductor element is provided with an insulated gate bipolar transistor (IGBT), for example, the first main terminal is connected to a collector electrode of the IGBT and the second main terminal is connected to an emitter electrode of the IGBT.

SUMMARY

The present disclosure describes a semiconductor device including a first main terminal, and a second main terminal. The first main terminal and the second main terminal, respectively, have a first projecting portion and a second projecting portion projecting outside of an insulating member. The first projecting portion and the second projecting portion, respectively, have a first facing portion and a second facing portion at which plate surfaces of the first projecting portion and the second projecting portion face each other across a gap and being disposed so as to cancel each other magnetic fluxes caused by main currents flowing in the first main terminal and the second main terminal. The first projecting portion and the second projecting portion, respectively, have a first non-facing portion at which the plate surface of the first projecting portion does not face the plate surface of the second projecting portion and a second non-facing portion at which the plate surface of the second projecting portion does not face the plate surface of the first projecting portion.

BRIEF DESCRIPTION OF DRAWINGS

The above and other objects, features and advantages of the present disclosure will become more apparent from the following detailed description made with reference to the accompanying drawings, in which.

DETAILED DESCRIPTION

Figure 1:
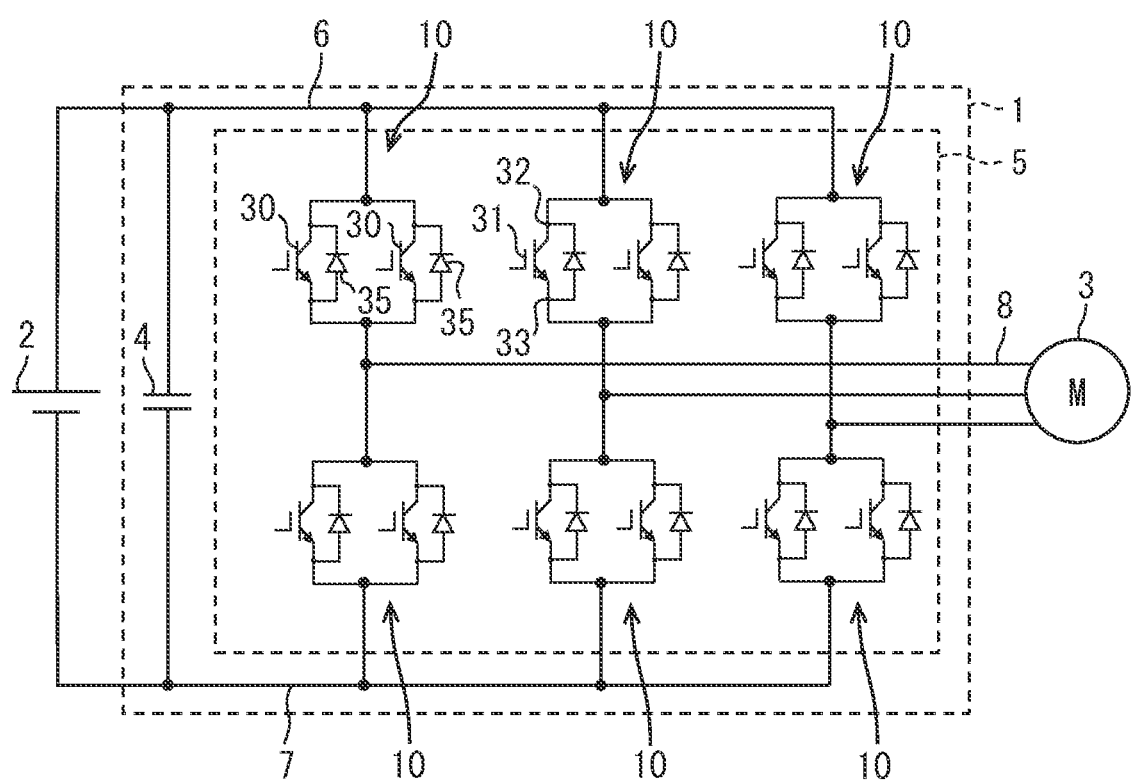
FIG. 1 is a diagram showing a schematic configuration of a power conversion device to which a semiconductor device according to a first embodiment is applied.
Figure 2:
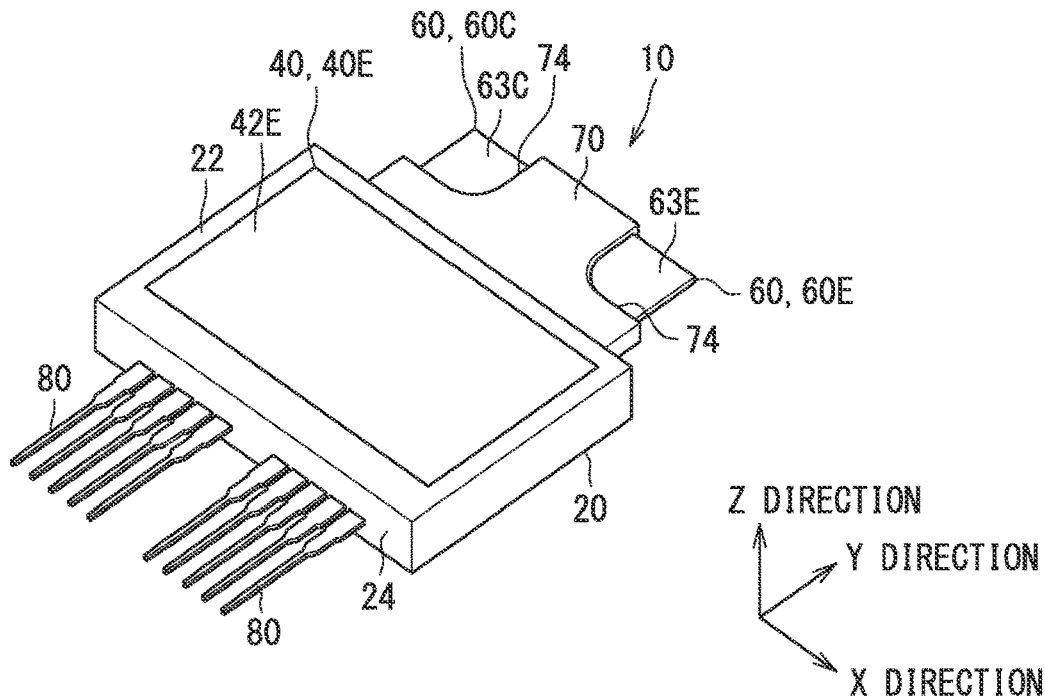
FIG. 2 is a perspective view of the semiconductor device.
Figure 3:
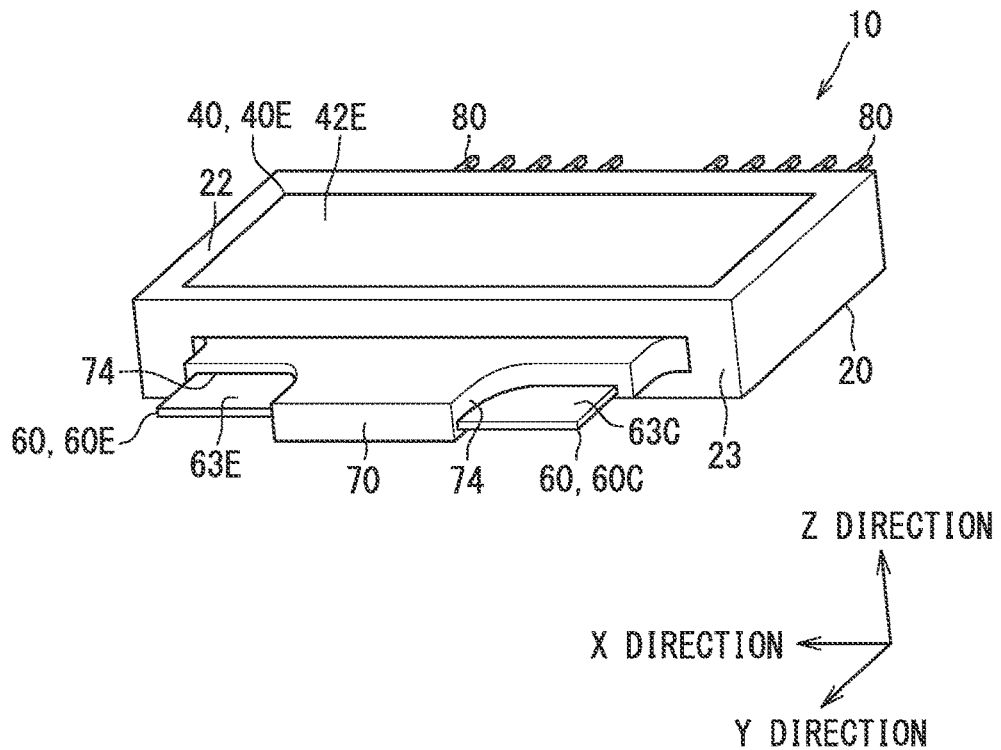
FIG. 3 is a perspective view of the semiconductor device.
Figure 4:
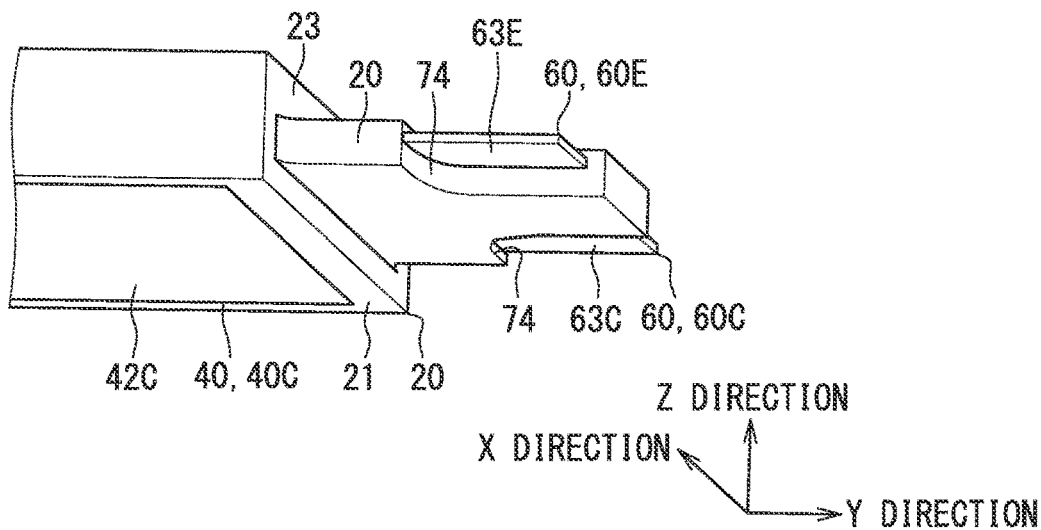
FIG. 4 is a perspective view of the semiconductor device.

A semiconductor device has a semiconductor element, conductive members connected to electrodes of the semiconductor element on opposite sides of the semiconductor element, and main terminals extending from the conductive members. The main terminals include a first main terminal and a second main terminal. For example, the first main terminal and the second main terminal are arranged side by side in a plate width direction. Since the first main terminal and the second main terminal have different potentials, a predetermined creepage distance is necessary between the first main terminal and the second main terminal in order to ensure insulation. In the configuration where the first main terminal and the second main terminal are arranged side by side in a plate width direction, it is difficult to reduce a distance between the first main terminal and the second main terminal in the plate width direction to reduce the inductance.

In such a semiconductor device, the main terminals project outside of a sealing resin body to enable connection with external members, such as bus bars. The bus bars are connected to plate surfaces of the main terminals outside of the sealing resin body. Therefore, it is preferable to arrange the main terminals so as to facilitate the connection with external members.

According to an aspect of the present disclosure, a semiconductor device includes a semiconductor element, a first conductive member, a second conductive member, an insulating member, a first main terminal, and a second main terminal. The semiconductor element has a first surface and a second surface opposite to the first surface. The semiconductor element includes a first main electrode adjacent to the first surface and a second main electrode adjacent to the second surface. The first conductive member is disposed adjacent to the first surface of the semiconductor element and connected to the first main electrode. The second conductive member is disposed adjacent to the second surface of the semiconductor element and connected to the second main electrode. The insulating member integrally covers and protects at least a part of each of the first and the second conductive members and the semiconductor element. The first main terminal connects to the first conductive member, and the second main terminal connects to the second conductive member.

The first main terminal and the second main terminal, respectively, have a first projecting portion and a second projecting portion projecting outside of the insulating member. The first projecting portion and the second projecting portion, respectively, have a first facing portion and a second facing portion at which plate surfaces of the first projecting portion and the second projecting portion face each other across a gap. The first facing portion and the second facing portion are disposed so as to cancel each other magnetic fluxes caused by main currents flowing in the first main terminal and the second main terminal. The first projecting portion and the second projecting portion, respectively, have a first non-facing portion at which the plate surface of the first projecting portion does not face the plate surface of the second projecting portion in the plate thickness direction and a second non-facing portion at which the plate surface of the second projecting portion does not face the plate surface of the first projecting portion.

In such a configuration, the first projecting portion and the second projecting portion are disposed such that the plate surfaces face each other at the first facing portion and the second facing portion across the gap. A predetermined insulation can be secured by the gap, and an inductance can be reduced by the facing portions facing each other.

Further, the first projecting portion and the second projecting portion, respectively, have the first non-facing portion and the second non-facing portion. The plate surface of the first projecting portion does not face the plate surface of the second projecting portion at the first non-facing portion. The plate surface of the second projecting portion does not face the plate surface of the first projecting portion at the second non-facing portion. Therefore, it is easy to connect bus bars or the like to the plate surfaces of the first and second projecting portions at the first and second non-facing portions. Thus, the connectivity between the main terminal and external members can be improved.

Embodiments of the present disclosure will be described hereinafter with reference to the drawings. In the embodiments, functionally and/or structurally corresponding parts are denoted by the same reference numerals. Hereinafter, a thickness direction of switching elements (semiconductor elements) is referred to as a Z direction, and one direction orthogonal to the Z direction is referred to as an X direction. A direction orthogonal to both the Z direction and the X direction is referred to as a Y direction. Unless otherwise specified, a shape along an XY plane defined by the X direction and the Y direction is a planar shape.

First Embodiment (Schematic Configuration of Power Converter)

A power conversion device 1 shown in FIG. 1 is mounted on, for example, an electric vehicle or a hybrid vehicle. The power conversion device 1 converts a DC voltage supplied from a DC power source 2 of a vehicle into three-phase AC, and outputs the three-phase AC to a motor 3 of a three-phase AC system. The motor 3 functions as a travel driving source of the vehicle. The power conversion device 1 can also convert an electric power generated by the motor 3 into a DC and charge the DC power source 2. In this manner, the power conversion device 1 is capable of performing a bidirectional power conversion.

The power conversion device 1 includes a smoothing capacitor 4 and an inverter 5 as a power converter. The smoothing capacitor 4 has a positive electrode terminal connected to a positive electrode of the DC power source 2, which is a high potential side electrode of the DC power source 2, and a negative electrode terminal connected to a negative electrode of the DC power source 2, which is a low potential side electrode of the DC power source 2. The inverter 5 converts a DC power received from the DC power source 2 into a three-phase AC having a predetermined frequency, and outputs the three-phase AC to the motor 3. The inverter 5 converts the AC power generated by the motor 3 into a DC power.

The inverter 5 includes upper and lower arm circuits for three phases. The upper and lower arm circuit of each phase includes two arms, that is, upper and lower arms connected in series between a high potential power supply line 6 on the positive electrode side and a low potential power supply line 7 on the negative electrode side. In the upper and lower arm circuit of each phase, a connection point between the upper arm and the lower arm is connected to an output line 8 connecting to the motor 3.

In the present embodiment, an insulated gate bipolar transistor (hereinafter referred to as an IGBT) is employed as a semiconductor element constituting each arm. A semiconductor device 10 includes two IGBTs 30 connected in parallel to each other. FWDs 35 as freewheel diodes are connected in anti-parallel to the IGBTs 30, respectively. Each arm has two IGBTs 30 connected in parallel to each other. Reference numeral 31 shown in FIG. 1 denotes gate electrodes of the IGBTs 30. The two IGBTs 30 connected in parallel to each other are driven simultaneously by one driver (not shown). In other words, the gate electrodes 31 of the two IGBTs 30 are electrically connected to the same gate driver.

The IGBT 30 is an n-channel type IGBT. In the upper arm, collector electrodes 32 of the IGBTs 30 are electrically connected to the high potential power supply line 6. In the lower arm, emitter electrodes 33 of the IGBTs 30 are electrically connected to the low potential power supply line 7. Emitter electrodes 33 of the IGBTs 30 in the upper arm and collector electrodes 32 of the IGBTs 30 in the lower arm are connected to each other.

The power conversion device 1 may include, in addition to the smoothing capacitor 4 and the inverter 5, a boost converter for boosting the DC voltage supplied from the DC power source 2, a gate drive circuit for driving semiconductor elements that constitute the inverter 5 and the boost converter, and the like.

(Schematic Configuration of Semiconductor Device)

As shown in FIGS. 2 to 9, the semiconductor device 10 includes a sealing resin body 20, the IGBTs 30, heat sinks 40, terminal members 50, main terminals 60, a terminal covering portion 70, and signal terminals 80.

The sealing resin body 20 is made of, for example, an epoxy resin. The sealing resin body 20 is molded by, for example, a transfer molding method. As shown in FIGS. 2 to 4 and 6, the sealing resin body 20 has one surface 21 and a rear surface 22 opposite to the one surface 21 in the Z direction. The one surface 21 and the rear surface 22 are, for example, flat surfaces. The sealing resin body 20 has lateral surfaces connecting the one surface 21 and the rear surface 22. In the present embodiment, the sealing resin body 20 has a substantially rectangular shape in a plan view.

Figure 5:
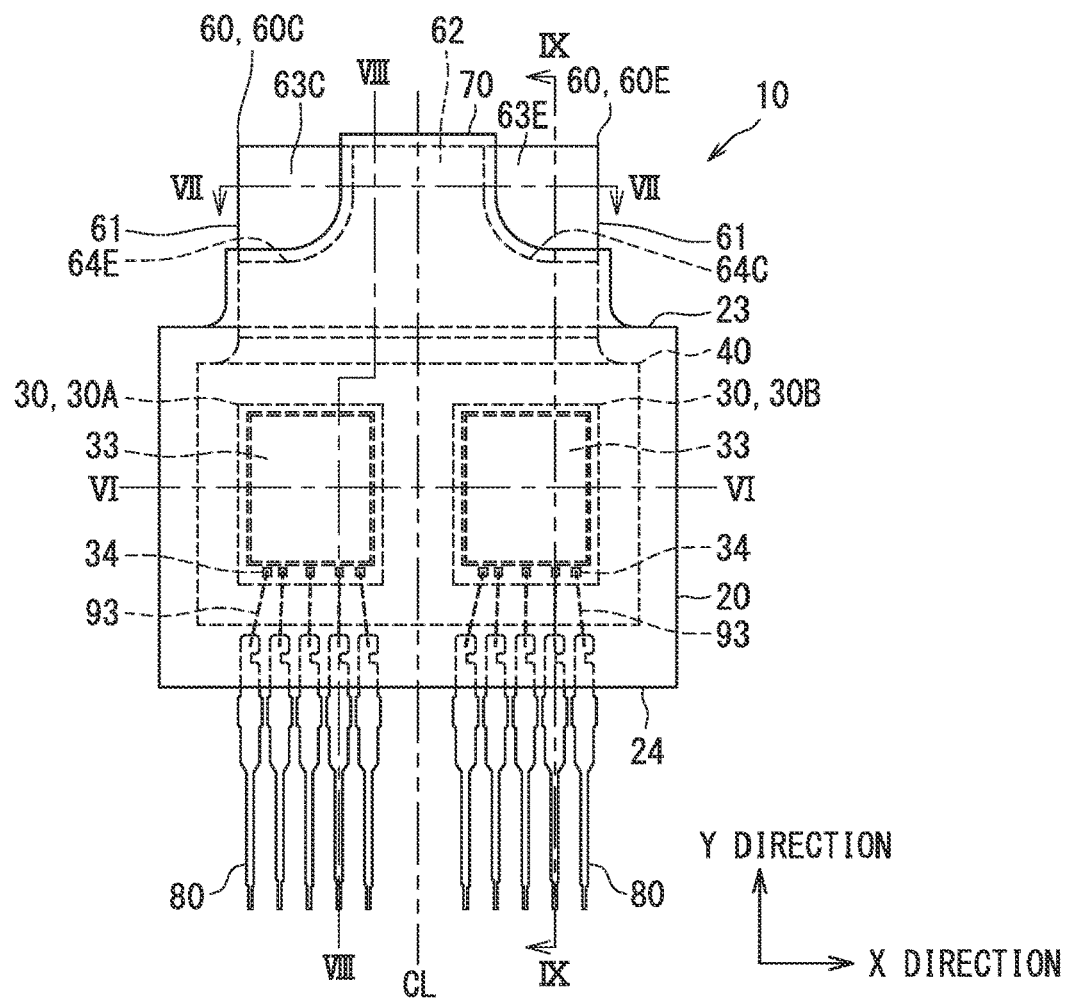
FIG. 5 is a plan view of the semiconductor device for showing an arrangement of main terminals and a terminal covering portion.
Figure 6:
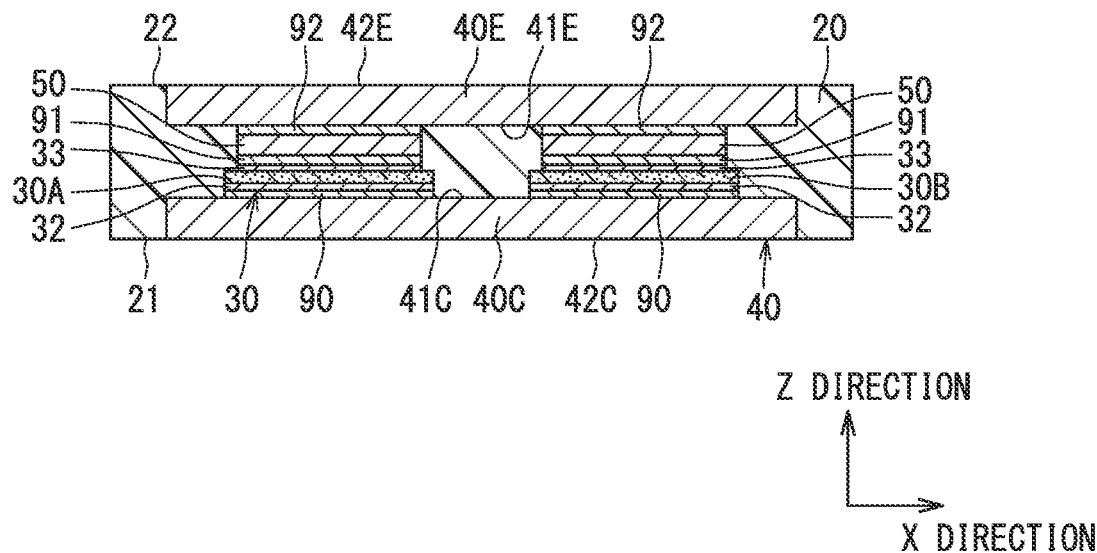
FIG. 6 is a cross-sectional view taken along a line VI-VI in FIG. 5.

The IGBTs 30 as semiconductor elements are each formed in a semiconductor substrate (semiconductor chip) made of Si, SiC, GaN or the like. As shown in FIGS. 5 and 6, the semiconductor device 10 includes two IGBTs 30. The two IGBTs 30 are connected in parallel to each other. Hereinafter, of the two IGBTs 30, one is also referred to as an IGBT 30A and the other is also referred to as an IGBT 30B for the purpose of distinction. In the present embodiment, each IGBT 30 is integrally formed with the FWD 35. In other words, an RC (Reverse Conducting)-IGBT is employed as the IGBT 30.

Each IGBT 30 has a vertical structure so that a main current flows in the Z direction. The IGBT 30 has the gate electrode 31, although not shown in FIGS. 2 to 9. The gate electrode 31 has a trench structure. The IGBT 30 has the collector electrode 32 adjacent to its one surface (first surface) and the emitter electrode 33 adjacent to its rear surface (second surface) opposite to the one surface in the thickness direction of the IGBT 30, that is, in the Z direction. The collector electrode 32 also serves as a cathode electrode of the FWD 35, and the emitter electrode 33 also serves as an anode electrode of the FWD 35. The collector electrode 32 corresponds to a first main electrode, and the emitter electrode 33 corresponds to a second main electrode.

The two IGBTs 30 have substantially the same planar shape, specifically, a substantially rectangular planar shape, and have substantially the same size and substantially the same thickness. The IGBTs 30A and 30B have the same configuration. The IGBTs 30A and 30B are disposed such that the collector electrodes 32 are on the same side in the Z direction and the emitter electrodes 33 are on the same side in the Z direction. The IGBTs 30A and 30B are positioned at substantially the same height in the Z direction and are aligned side by side in the X direction.

Each IGBT 30 has pads 34 as signal electrodes on the rear surface on which the emitter electrode 33 is formed. The pads 34 are formed at a position different from the emitter electrode 33. The pads 34 are electrically isolated from the emitter electrode 33. On the rear surface, the pads 34 are formed at an end opposite to a formation region of the emitter electrode 33 where the emitter electrode 33 is formed, in the Y direction.

In the present embodiment, each IGBT 30 has five pads 34. Specifically, the five pads 34 are provided for a gate electrode, a Kelvin emitter for detecting a potential of the emitter electrode 33, a current sense, an anode potential of a temperature sensor (temperature sensitive diode) for detecting the temperature of the IGBTs 30, and a cathode potential. The five pads 34 are collectively formed at the end in the Y direction and are aligned in the X direction, in the IGBT 30 having the substantially rectangular planar shape.

The heat sinks 40 are conductive members, and are disposed on opposite sides of the IGBTs 30 in the Z direction. The heat sinks 40 function to dissipate heat of the IGBTs 30 to the outside of the semiconductor device 10, and also function as wirings for the main electrodes. For that reason, in order to have thermal conductivity and electrical conductivity, the heat sinks 40 are made of at least a metal material. The heat sinks 40 are disposed so as to encompass the two IGBTs 30 in a projection view in the Z direction. The heat sinks 40 each have a substantially rectangular planar shape with the X direction as a longitudinal direction. The heat sink 40 has a substantially constant thickness. The heat sink 40 is disposed such that a plate thickness direction is substantially parallel to the Z direction.

The heat sinks 40 are provided in a pair so as to interpose the IGBTs 30 therebetween. The semiconductor device 10 has, as the pair of heat sinks 40, a heat sink 40C disposed adjacent to the collector electrodes 32 of the IGBTs 30 and a heat sink 40E disposed adjacent to the emitter electrodes 33 of the IGBTs 30. The heat sink 40C corresponds to a first conductive member, and the heat sink 40E corresponds to a second conductive member. The heat sinks 40C and 40E substantially coincide with each other in a projection view in the Z direction. The heat sink 40C has a connection surface 41C facing the IGBTs 30 and a heat dissipation surface 42C opposite to the connection surface 41C in the Z direction. The heat sink 40E has a connection surface 41E facing the IGBTs 30 and a heat dissipation surface 42E opposite to the connection surface 41E in the Z direction. The heat dissipation surface 42C corresponds to a first heat dissipation surface, and the heat dissipation surface 42E corresponds to a second heat dissipation surface.

The connection surface 41C of the heat sink 40C is connected to the collector electrodes 32 of the IGBTs 30A and 30B individually through solder 90. Most part of the heat sink 40C is covered with the sealing resin body 20. The heat dissipation surface 42C of the heat sink 40C is exposed from the sealing resin body 20. The heat dissipation surface 42C is substantially flush with the one surface 21. The surfaces of the heat sink 40C excluding connection portions with the solders 90, the heat dissipation surface 42C, and a connection portion with the main terminal 60 are covered with the sealing resin body 20.

The terminal members 50 are interposed between the IGBTs 30 and the heat sink 40E. The terminal members 50 are correspondingly provided for the IGBTs 30A and 30B. The terminal members 50 are each positioned in the middle of the thermal conduction path and electrical conduction path between the emitter electrode 33 of the IGBTs 30 and the heat sink 40E. Therefore, the terminal members 50 are made of at least a metal material in order to have thermal conductivity and electrical conductivity. The terminal members 50 are disposed to face the emitter electrodes 33 of the corresponding IGBTs 30, and are connected to the emitter electrodes 33 through solders 91.

The connection surface 41E of the heat sink 40E is electrically connected to the emitter electrodes 33 of the IGBTs 30A and 30B individually through solders 92. Specifically, the heat sink 40E is electrically connected to each emitter electrode 33 through the solder 91, the terminal member 50, and the solder 92. Most part of the heat sink 40E is covered with the sealing resin body 20. The heat dissipation surface 42E of the heat sink 40E is exposed from the sealing resin body 20. The heat dissipation surface 42E is substantially flush with the rear surface 22. The surfaces of the heat sink 40E excluding connection portions with the solders 92, the heat dissipation surface 42E, and a connection portion with the main terminal 60 are covered with the sealing resin body 20.

The main terminals 60 are terminals through which a main current flows, among external connection terminals for electrically connecting the semiconductor device 10 and an external device. The main terminals 60 connect to the corresponding heat sinks 40 inside the sealing resin body 20. The main terminals 60 extend from the corresponding heat sinks 40, and project outward from a lateral surface 23, which is one of the lateral surfaces of the sealing resin body 20, as shown in FIGS. 5, 7 to 9. The main terminals 60 extend from the inside to the outside of the sealing resin body 20. The main terminals 60 each have a projecting portion 61 projecting to the outside of the sealing resin body 20.

The main terminals 60 are electrically connected to the main electrodes of the IGBTs 30. The semiconductor device 10 has, as the main terminals 60, a main terminal 60C electrically connected to the collector electrodes 32 and a main terminal 60E electrically connected to the emitter electrodes 33. The main terminal 60C corresponds to a first main terminal, and the main terminal 60E corresponds to a second main terminal. The main terminal 60C is also referred to as a collector terminal, and the main terminal 60E is also referred to as an emitter terminal.

The main terminal 60C connects to the heat sink 40C. The main terminal 60C extends in the Y direction from the heat sink 40C and projects outward from the lateral surface 23 of the sealing resin body 20. The main terminal 60E connects to the heat sink 40E. The main terminal 60E extends from the heat sink 40E in the same direction as the main terminal 60E, and projects outward from the same lateral surface 23 as the main terminal 60C.

Figure 8:
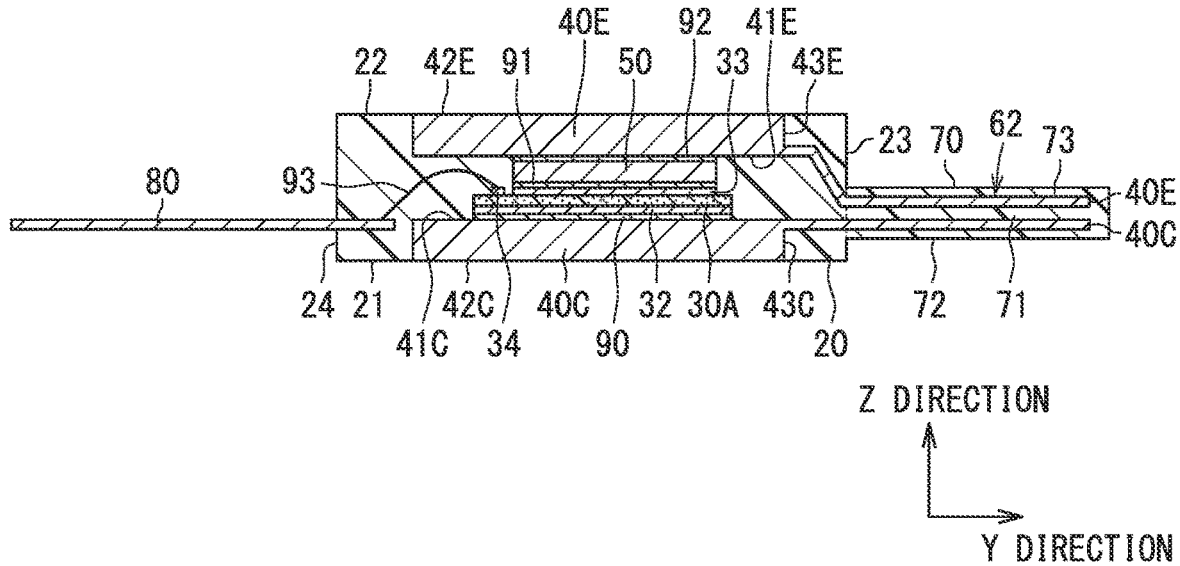
FIG. 8 is a cross-sectional view taken along a line VIII-VIII in FIG. 5.
Figure 9:
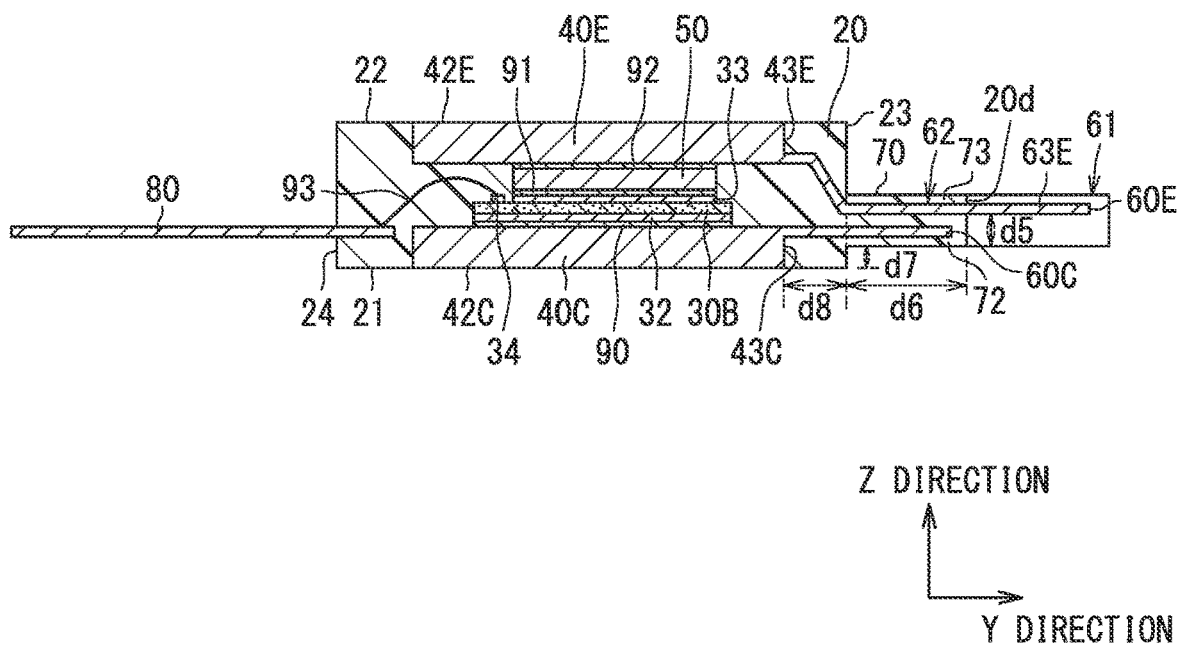
FIG. 9 is a cross-sectional view taken along a line IX-IX in FIG. 5.

In the present embodiment, as shown in FIGS. 8 and 9, the main terminals 60C and 60E connect to lateral surfaces 43C and 43E of the corresponding heat sinks 40C and 40E, respectively. The lateral surface 43C is a surface of the heat sink 40C on the same side as the lateral surface 23. The lateral surface 43E is a surface of the heat sink 40E on the same side as the lateral surface 23. The main terminals 60C and 60E connect to the corresponding heat sinks 40C and 40E on the same side in the Y direction. The main terminals 60C and 60E extend substantially in the same direction over their entire length.

The main terminals 60 are each integrally formed with the corresponding heat sink 40 by processing the same metal plate. The main terminal 60C has a thickness smaller than that of the heat sink 40C, and connects to the connection surface 41C of the heat sink 40C to have a substantially coplanar surface with the connection surface 41C. The main terminal 60E has a thickness smaller than that of the heat sink 40E, and connects to the connection surface 41E of the heat sink 40E to have a substantially coplanar surface with the connection surface 41E. In the projecting portions 61, the main terminals 60C and 60E have the plate thickness direction substantially in the Z direction. Each of the main terminals 60 has a substantially constant plate thickness. The main terminals 60C and 60E have substantially the same plate thickness.

The terminal covering portion 70 is formed of a resin material and covers a part of the projecting portion 61 of each of the main terminals 60. Details of the main terminals 60 and the terminal covering portion 70 will be described later.

The signal terminals 80 are electrically connected to the pads 34 of the IGBTs 30 through bonding wires 93, respectively. The signal terminals 80 are connected to the bonding wires 93 inside the sealing resin body 20, and project outward from the lateral surface of the sealing resin body 20, more specifically, a lateral surface 24 opposite to the lateral surface 23 in the Y direction. The signal terminals 80 corresponding to the respective IGBTs 30 extend in the Y direction.

In the semiconductor device 10 configured as described above, the two IGBTs 30 are connected in parallel between the heat sinks 40C and 40E, that is, between the main terminals 60C and 60E.

Further, the sealing resin body 20 integrally seals the IGBTs 30 (30A, 30B), a part of each of the heat sinks 40, the terminal members 50, a part of each of the main terminals 60, and a part of each of the signal terminals 80. In other words, the sealing resin body 20 seals the elements forming one arm. Therefore, the semiconductor device 10 is also referred to as "1-in-1 package". The sealing resin body 20 integrally covers and protects at least the parts of the heat sinks 40C and 40E and the IGBTs 30A and 30B. The sealing resin body 20 corresponds to an insulating member.

The heat dissipation surface 42C of the heat sink 40C is substantially flush with the one surface 21 of the sealing resin body 20. The heat dissipation surface 42E of the heat sink 40E is substantially flush with the rear surface 22 of the sealing resin body 20. The semiconductor device 10 has a double-sided heat dissipation structure in which the heat dissipation surfaces 42C and 42E are both exposed from the sealing resin body 20. For example, the semiconductor device 10 can be formed by cutting the heat sinks 40 together with the sealing resin body 20. As another example, the semiconductor device 10 can be formed by molding the sealing resin body 20 in a state where the heat dissipation surfaces 42C and 42E are in contact with a wall surface of a cavity of a mold.

(Details of Main Terminal and Terminal Covering Portion)

As described above, the semiconductor device 10 has, as the main terminals 60, the main terminal 60C connecting to the heat sink 40C and the main terminal 60E connecting to the heat sink 40E. As shown in FIGS. 5, and 7 to 9, the main terminals 60 each have a facing portion 62 at which plate surfaces of the main terminals 60C and 60E face each other with a gap, as the part of the projecting portion 61. The plate surface is a surface facing in the plate thickness direction of each of the main terminals 60. The main terminals 60C, 60E overlap each other at the facing portions 62 in a projection view in the Z direction. Thus, the facing portions 62 are also referred to as overlapping portions. The facing portions 62 are also referred to as overlaid portions.

The facing portion 62 is provided in a region from a bent portion of the main terminal 60 to a projecting distal end of the projecting portion 61. Due to the bent portion, a facing distance between the facing portions 62 of the main terminals 60C and 60E is shorter than a distance between the heat sinks 40C and 40E, that is, a distance between the connection surfaces 41C and 41E. The projecting portion 61 of each of the main terminals 60C, 60E has the facing portion 62 as a main part, and a remaining part of the projecting portion 61 is a non-facing portion 63C, 63E at which the plate surfaces do not face each other between the main terminals 60C, 60E in the Z direction. The facing portion 62 of the projecting portion 61 of the main terminal 60C may correspond to a first facing portion, and the facing portion 62 of the projecting portion 61 of the main terminal 60E may correspond to a second facing portion.

The facing portions 62 are disposed so as to cancel magnetic fluxes, which are caused when main currents flow in the main terminals 60C and 60E. In order to enhance the effect of the magnetic flux cancellation, the facing portions 62 are disposed so that the direction of the main current is substantially opposite between the facing portions 62. In other words, the directions of extension of the main terminals 60C and 60E with respect to the corresponding heat sinks 40 are substantially the same between the facing portions 62.

The non-facing portion 63C is a part of the projecting portion 61 of the main terminal 60C. The plate surface of the non-facing portion 63C of the main terminal 60C does not face the plate surface of the main terminal 60E in the Z direction. The non-facing portion 63E is a part of the projecting portion 61 of the main terminal 60E. The plate surface of the non-facing portion 63E of the main terminal 60E does not face the plate surface of the main terminal 60C in the Z direction. The non-facing portion 63C corresponds to a first non-facing portion, and the non-facing portion 63E corresponds to a second non-facing portion. The non-facing portions 63C and 63E are also referred to as non-overlapping portions or non-overlaid portions. As described above, the main terminals 60 have the facing portions 62 and the non-facing portions 63C and 63E, as the projecting portions 61.

In the present embodiment, the main terminal 60E has the bent portion. The main terminal 60E has the projecting portion 61 in an area from the bent portion to the distal end. The projecting portion 61 of the main terminal 60E extends in the Y direction without a bent, and has a flat plate shape in which the plate thickness direction substantially coincides with the Z direction. That is, the plate thickness is substantially uniform. As shown in FIG. 5, the projecting portion 61 of the main terminal 60E has a substantially rectangular planar shape from which one of the four corners is cut off. The projecting portion 61 of the main terminal 60C has a flat plate shape in which plate thickness direction substantially coincides with the Z direction, similarly to the main terminal 60E. That is, the plate thickness is substantially uniform. The projecting portion 61 of the main terminal 60C has a substantially rectangular planar shape from which one of the four corners is cut off.

The plate thickness directions of the projecting portions 61 of the main terminals 60C and 60E substantially coincide with each other. Therefore, the plate surfaces of the facing portions 62 of the main terminals 60C and 60E face each other in the plate thickness direction. The gap between the main terminals 60C and 60E is substantially constant over the entire area in the facing portions 62. As shown in FIG. 8, the main terminals 60C and 60E face each other via the sealing resin body 20 even inside of the sealing resin body 20.

The main terminal 60C has a notch 64C, and the main terminal 60E has a notch 64E. The notch 64C corresponds to a first notch, and the notch 64E corresponds to a second notch. The notch 64C is formed at one end of the main terminal 60C in a plate width direction that is orthogonal to the plate thickness direction and the extending direction of the main terminal 60, that is, in the X direction. The notch 64E is formed at an end of the main terminal 60E opposite to the notch 64C in the plate width direction. The projecting lengths of the projecting portions 61 are substantially equal between the main terminals 60C and 60E. The notches 64C and 64E are formed at the projecting distal ends of the projecting portions 61. The notches 64C and 64E each have a substantially arc shape.

The projecting portions 61 of the main terminals 60C and 60E are arranged in line symmetry with respect to a center line CL passing through an elemental center of the IGBTs 30. The elemental center is the center of the IGBTs 30 as a whole. In the case of the present embodiment, since the semiconductor device 10 has two IGBTs 30A and 30B, the elemental center is the central position between the centers of the two IGBTs 30A and 30B in the arrangement direction of the IGBTs 30A and 30B. In the case of having only one IGBT 30, the elemental center is the center of the IGBT 30. The center line CL is an imaginary line that is orthogonal to the plate width direction and passes through the elemental center.

As shown in FIGS. 2, 5 to 9, in the projecting portion 61, in a predetermined region from the lateral surface 23 in the Y direction, specifically, a region from the lateral surface 23 to the notch 64C, 64E is provided entirely as the facing portion 62. On the other hand, a region from the notch 64C, 64E to the projecting distal end includes the facing portion 62 and the non-facing portion 63C, 63E.

In the region adjacent to the projecting distal end, the facing portions 62 are provided between the non-facing portions 63C and 63E in the X direction. At a center area of the projecting portions 61 in the X direction, which is the plate width direction, the facing portions 62 are provided from the lateral surface 23 to the protruding distal end. At both ends of the projecting portions 61 in the X direction, the facing portions 62 are provided from the lateral surface 23 to the middle, and the non-facing portions 63 C, 63 E are provided from the middle to the projecting distal end, in the Y direction.

The non-facing portion 63C is disposed at a position farther from the heat dissipation surface 42E of the heat sink 40E than the non-facing portion 63E in the Z direction. The non-facing portion 63E is disposed at a position farther from the heat dissipation surface 42C of the heat sink 40C than the non-facing portion 63C in the Z direction.

Figure 7:
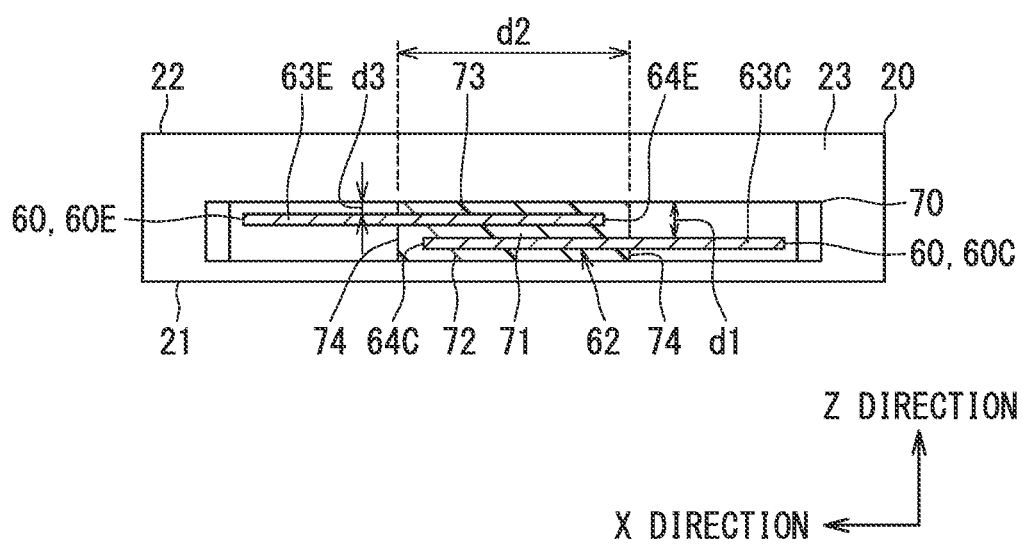
FIG. 7 is a cross-sectional view taken along a line VII-VII in FIG. 5.

The terminal covering portion 70 covers at least a part of the facing portion 62 of each of the main terminals 60C and 60E. The terminal covering portion 70 connects to the sealing resin body 20. The sealing resin body 20 corresponds to a first resin part, and the terminal covering resin 70 corresponds to a second resin part. As shown in FIGS. 7 to 9, the terminal covering portion 70 includes at least an interposed portion 71.

In the present embodiment, the terminal covering portion 70 includes rear surface covering portions 72 and 73 in addition to the interposed portion 71. The terminal covering portion 70 is integrally molded with the same material as the sealing resin body 20. The sealing resin body 20 and the terminal covering portion 70 are provided by an integrally molded part.

The interposed portion 71 is interposed between facing surfaces of the facing portions 62 of the main terminals 60C and 60E. The facing surface is a surface facing each other among the plate surfaces. In the present embodiment, the interposed portion 71 is arranged in the entire facing region between the facing portions 62 of the main terminals 60C and 60E. That is, the entire facing region is filled with the resin.

The rear surface covering portions 72 and 73 cover rear surfaces of the facing portions 62 of the main terminals 60, the rear surfaces being opposite to the facing surfaces of the main terminals 60. The rear surface covering portion 72 covers the rear surface of the main terminal 60C, and the rear surface covering portion 73 covers the rear surface of the main terminal 60E.

The terminal covering portion 70 entirely covers the facing portions 62. The terminal covering portion 70 also covers an end surface connecting the facing surface and the rear surface of each of the facing portions 62. In order to expose the non-facing portions 63C and 63E, the terminal covering portion 70 has a substantially rectangular planar shape from which two of the four corners are cut out, that is, a substantially convex shape. The non-facing portions 63C and 63E are exposed by notches 74 of the terminal covering portion 70 so as to be connectable with external members. The notches 74 have a substantially arc shape along the notches 64C and 64E. The terminal covering portion 70 also covers end surfaces of the notches 64C and 64E. The terminal covering portion 70 also covers the projecting distal end surface of the projecting portions 61. Therefore, exposed portions of the non-facing portions 63C and 63E also have a substantially arc shape at the ends adjacent to the terminal covering resin 70.

The terminal covering portion 70 has a smaller thickness than the sealing resin body 20. A surface of the rear surface covering portion 72 is not substantially flush with the one surface 21 in the Z direction, but is shifted toward the rear surface 22 than the one surface 21. A surface of the rear surface covering portion 73 is not substantially flush with the rear surface 22 in the Z direction, but is shifted toward the one surface 21 than the rear surface 22. The length of the terminal covering portion 70 in the X direction, that is, the width is smaller than the width of the sealing resin body 20. The terminal covering portion 70 is arranged in line symmetry with respect to the center line CL.

(Effects of Semiconductor Device)

As described above, the main terminals 60 have the projecting portions 61 including the facing portions 62. The facing portions 62 of the main terminals 60C and 60E are disposed so as to cancel each other magnetic fluxes caused by the main currents flowing in the main terminals 60C and 60E. The plate surfaces of the facing portions 62 of the main terminals 60C and 60E face each other while being separated from each other. Thus, the separated arrangement, that is, the arrangement having the predetermined gap, can maintain the insulation between the main terminals 60C and 60E. Further, since the plate surfaces face each other, the effect of canceling the magnetic flux can be enhanced and the inductance can be reduced.

Further, the plate surfaces of the main terminals 60C and 60E do not face each other over the entire area of the projecting portions 61. Instead, the main terminals 60C and 60E partly have the non-facing portions 63C and 63E, respectively. The plate surface of the non-facing portion 63C of the main terminal 60C does not face the plate surface of the main terminal 60E. The plate surface of the non-facing portion 63E of the main terminal 60E does not face the plate surface of the main terminal 60C. Thus, since the main terminals 60C and 60E are not overlaid in the non-facing portions 63C and 63E, it is easy to connect bus bars or the like to the plate surfaces of the main terminals 60. For example, the bus bars can be connected on the same side of the plate surfaces. Therefore, the connectivity between the main terminals 60 and the external members can be improved.

As described above, according to the semiconductor device 10 of the present embodiment, the connectivity with the external members can be improved while reducing the inductance.

Figure 10:
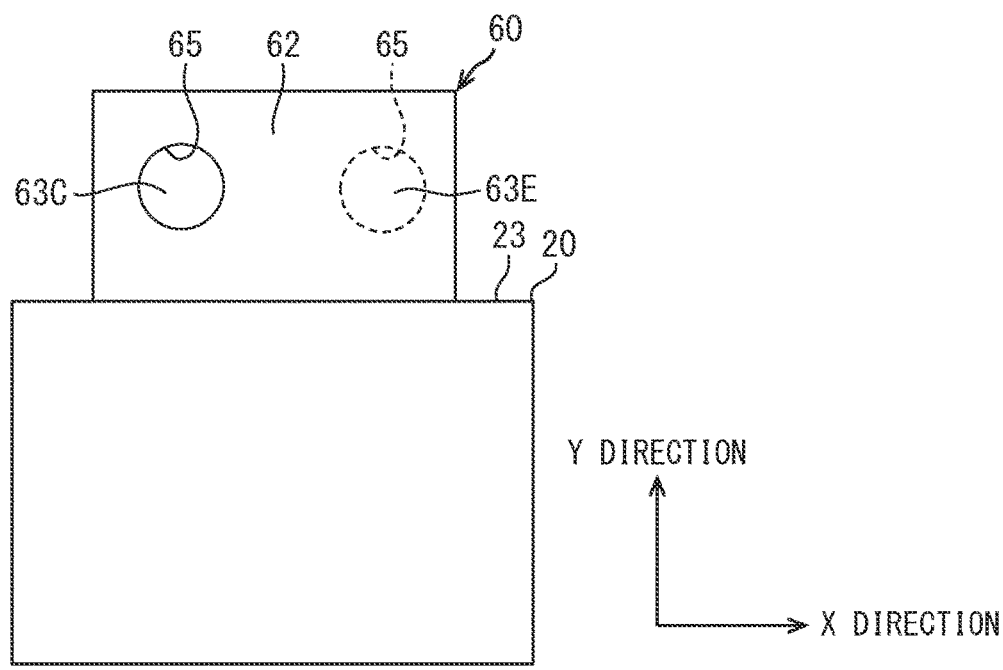
FIG. 10 is a plan view showing a first modification.
Figure 11:
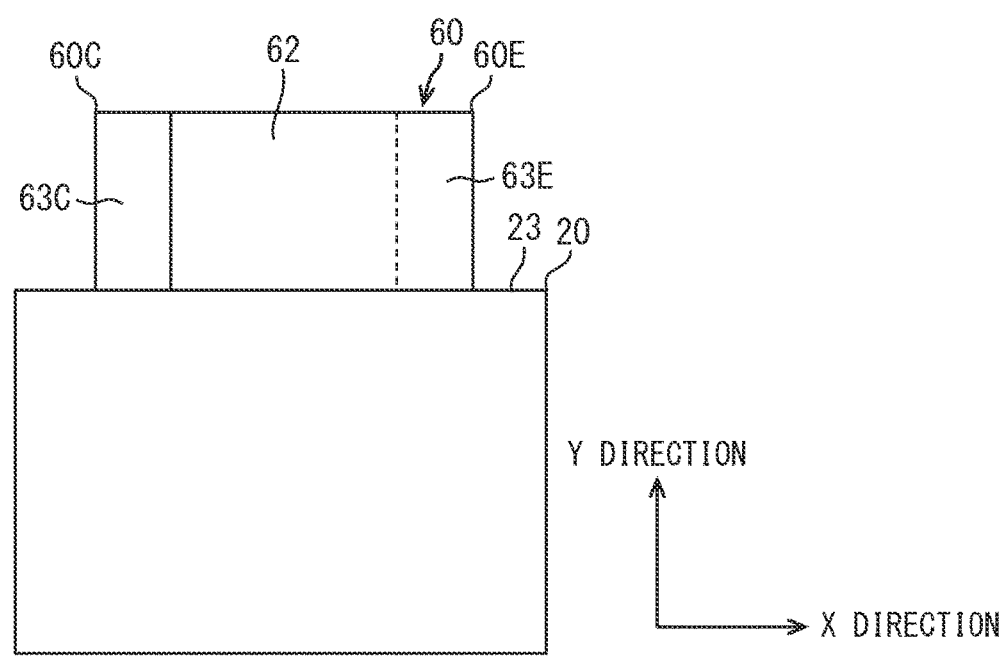
FIG. 11 is a plan view showing a second modification.

As in a first modification shown in FIG. 10, the non-facing portions 63C and 63E may be provided by through hole 65. In this case, in a projection view in the Z direction, of the two main terminals 60, one surrounds the non-facing portion 63C, 63E of the other. As in a second modification shown in FIG. 11, the non-facing portions 63C and 63E may be provided by arranging the main terminals 60C and 60E so as to be offset from each other in the plate width direction. In this case, the non-facing portions 63C and 63E are provided in areas from the lateral surface 23 to the projecting distal end in the Y direction. In FIGS. 10 and 11, for the convenience, only the sealing resin body 20 and the main terminals 60 are shown.

In the example shown in FIG. 5, the non-facing portions 63C and 63E are provided by the notches 64C and 64E. The non-facing portions 63C and 63E are formed at the ends of the main terminals 60C and 60E. In such a case, the connectivity with the external members further improve. In the case where the non-facing portions 63C and 63E are formed at the same position in the X or Y direction, a body size of the semiconductor device 10 in the X direction and the Y direction can be reduced. Further, in the case where the non-facing portions 63C and 63E are locally formed, the facing portions 62 can be made larger by that amount. Therefore, the inductance can be reduced.

Figure 12:
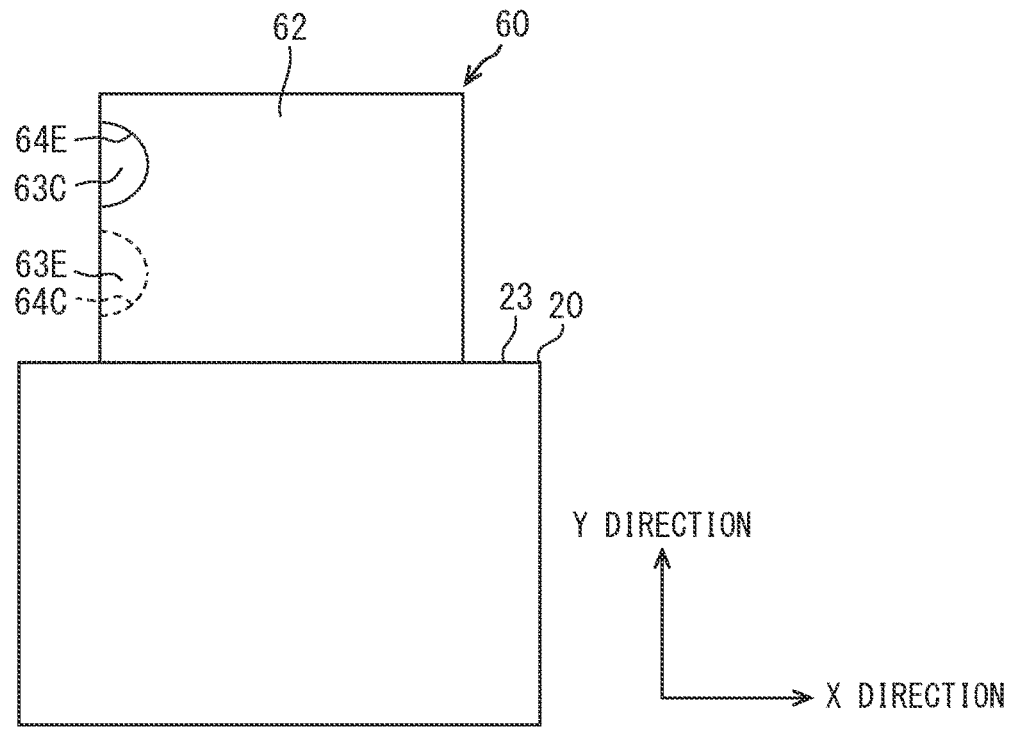
FIG. 12 is a plan view showing a third modification.
Figure 13:
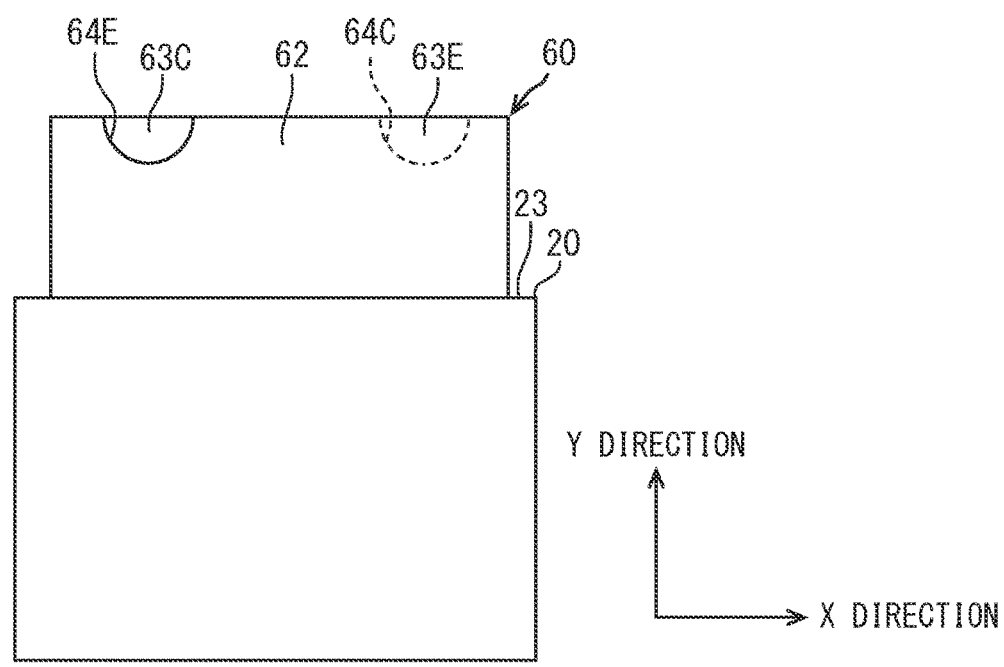
FIG. 13 is a plan view showing a forth modification.

As in a third modification shown in FIG. 12, the notches 64C and 64E may be formed on the same side in the plate width direction. In this case, the notches 64C and 64E are formed at positions where they do not overlap in the Y direction, which is the extending direction. As in a fourth modification shown in FIG. 13, the notches 64C and 64E may be formed at the projecting distal ends, but away from the ends in the plate width direction. In FIGS. 12 and 13, for the convenience, only the sealing resin body 20 and the main terminals 60 are shown.

In the example shown in FIG. 5, the main terminals 60C and 60E extend in the same direction from the same lateral surface 23 of the sealing resin body 20. The notch 64C is disposed at one end of the main terminal 60C in the plate width direction, and the notch 64E is disposed at the end of the main terminal 60E opposite to the notch 64C in the plate width direction. In the case where the notches 64C, 64E can be disposed at substantially the same position in the extending direction of the main terminals 60C, 60E, the body size in the Y direction can be reduced while reducing the inductance. In the case where the non-facing portions 63 C and 63 E are disposed at the same position in the Y direction, the body size in the X direction can be reduced.

Figure 14:
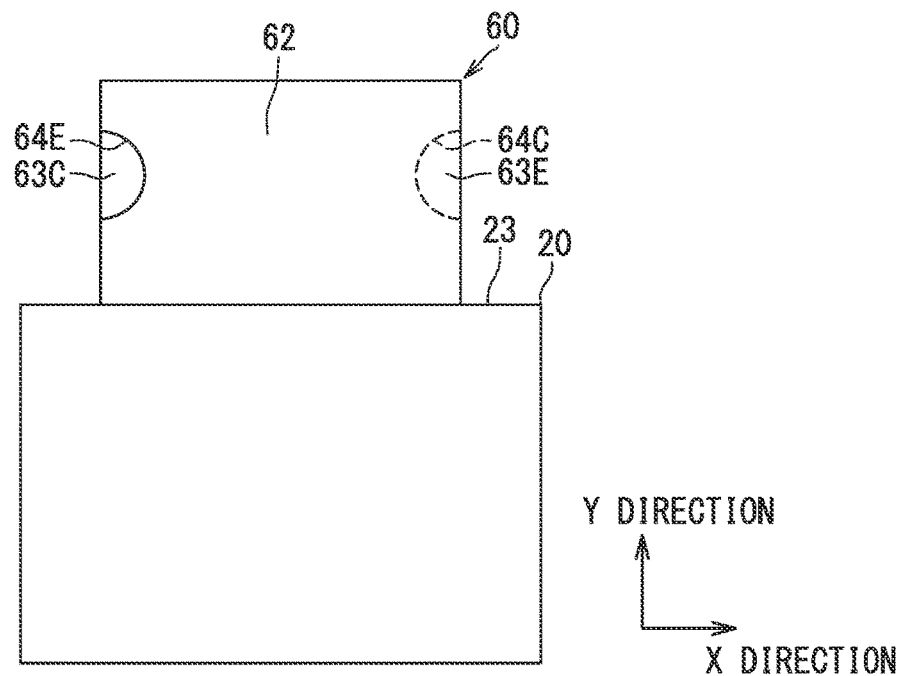
FIG. 14 is a plan view showing a fifth modification.

As in a fifth modification shown in FIG. 14, the notches 64C and 64E may be formed at the middle in the extending direction and at opposite ends in the plate width direction. In FIG. 14, for the convenience, only the sealing resin body 20 and the main terminals 60 are shown.

In the example shown in FIG. 5, the notches 64C and 64E are formed at the projecting distal ends at opposite ends in the plate width direction. In such a case, the body size in the Y direction can be reduced while reducing the inductance.

In the example shown in FIG. 5, the non-facing portions 63C and 63E are arranged in line symmetry with respect to the center line CL of the IGBTs 30. In such a case, the first component including the heat sink 40C and the main terminal 60C and the second component including the heat sink 40E and the main terminal 60E can be shared. That is, the number of components can be reduced.

Figure 15:
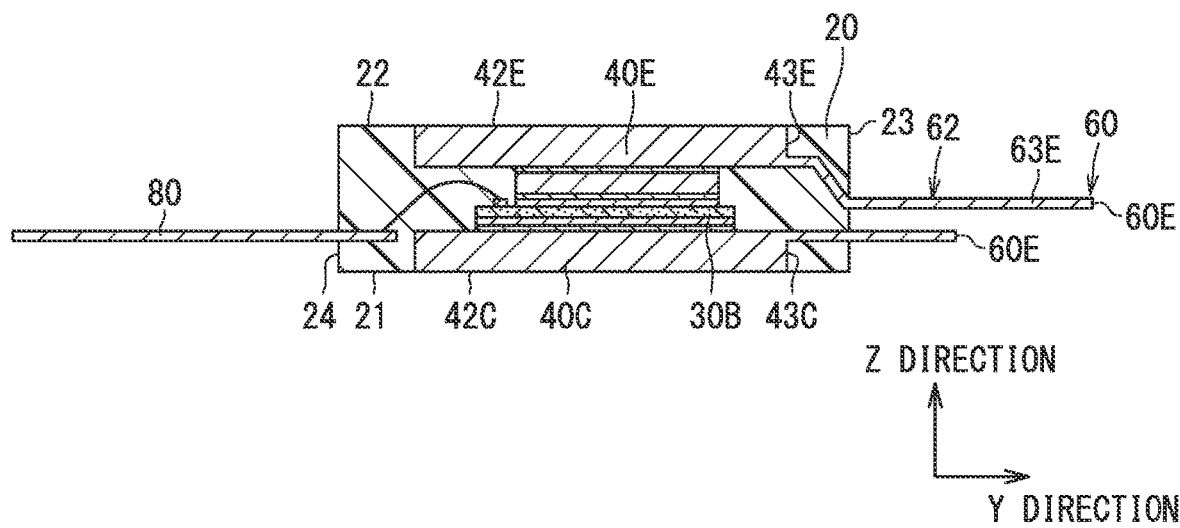
FIG. 15 is a plan view showing a sixth modification and corresponding to FIG. 9.

As in a sixth modification shown in FIG. 15, the projecting portions 61 of the main terminals 60 may not be covered with resin, so that air (gas) exists between the facing surfaces of the facing portions 62 of the main terminals 60C and 60E. In this case, a predetermined gap (space distance) is necessary between the facing surfaces for insulation between the main terminals 60C and 60E. The configuration shown in FIG. 15 is applicable depending on the voltage region in use of the semiconductor device 10. FIG. 15 corresponds to FIG. 9.

In the example shown in FIG. 5, the terminal covering portion 70 connects to the sealing resin body 20. The terminal covering portion 70 has the interposed portion 71 that is interposed between the main terminals 60C and 60E. Thus, the resin is filled between the facing surfaces, as shown in FIG. 8. In such a case, since interlayer insulation is used instead of space insulation, the facing surfaces of the main terminals 60C and 60E can be brought closer to each other due to the insulating ability of the resin. Therefore, the inductance can be further reduced.

In the example shown in FIG. 5, the terminal covering portion 70 covers not only a space between the facing surfaces but also the rear surfaces of the facing portions 62 opposite to the facing surface. That is, the terminal covering portion 70 covers the entire facing portions 62 together with the lateral surface 23 of the sealing resin body 20.

In such a configuration, a creepage distance of the non-facing portions 63C and 63E is determined by the sum of the lengths d1, d2 and d3, as shown in FIG. 7, for example. d1 is a length in the Z direction from the non-facing portion 63C to a surface of the rear surface covering portion 73. d2 is a length in the X direction of the rear surface covering portion 73, that is, the width. d3 is a length in the Z direction from the surface of the rear surface covering portion 73 to the non-facing portion 63E. Since the length d2 is the length of a portion covering the facing portion 62, the influence on the inductance is small even if the length d2 is increased. Therefore, it is easy to gain the creepage distance by the length d2.

Further, the creepage distance between the non-facing portion 63E and the heat dissipation surface 42C of the heat sink 40C is determined by the sum of the lengths d5, d6, d7 and d8 as shown in FIG. 9, for example. d5 is a length in the Z direction from the non-facing portion 63E to a surface of the rear surface covering portion 72. d6 is a shortest length in the Y direction from the notches 74 to the lateral surface 23. d7 is a length in the Z direction from the surface of the rear surface covering portion 72 to the one surface 21. d8 is a shortest length in the X direction from the lateral surface 23 to the heat dissipation surface 42C. Since the lengths d6 and d8 are the lengths of portions covering the facing portions of the main terminals 60C and 60E, the influence on the inductance is small even if the lengths d6 and d8 are increased. Therefore, it is easy to gain the creepage distance by the lengths d6 and d8. Although not described, the creepage distance between the non-facing portion 63C and the heat dissipation surface 42E of the heat sink 40E is the same.

Figure 16:
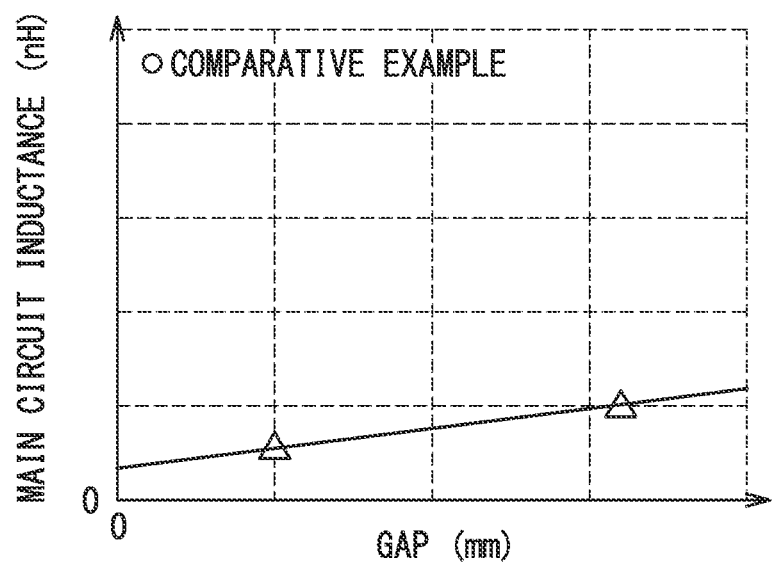
FIG. 16 is a diagram showing the relationship between a gap and a main circuit inductance, as a magnetic field analysis result.

FIG. 16 shows a magnetic field analysis result of the inductance of one arm of the upper and lower arm circuit forming a main circuit, specifically, the inductance between the main terminals 60C and 60E. A configuration in which the main terminals are arranged side by side in the plate width direction is used as a comparative example. In FIG. 16, the result of the comparative example is shown by a circle, and the results of the configuration of in the present embodiment are shown by triangles. The main circuit is a circuit including the smoothing capacitor 14 and the upper and lower arm circuits.

In the comparative example, a gap between the facing surfaces of the main terminals is substantially zero. It is clear from FIG. 16 that the configuration of the present embodiment can significantly reduce the inductance of the main circuit as compared with the comparative example. It is also clear that the smaller the gap between the facing portions 62 of the main terminals 60C and 60E, the more effectively the inductance of the main circuit can be reduced.

In the present embodiment, the terminal covering portion 70 has a smaller thickness than the sealing resin body 20. Thus, the resin amount of the terminal covering portion 70 can be reduced while securing the creepage distance between the heat dissipation surfaces 42C and 42E of the heat sinks 40C and 40E and the non-facing portions 63C and 63E.

Figure 17:
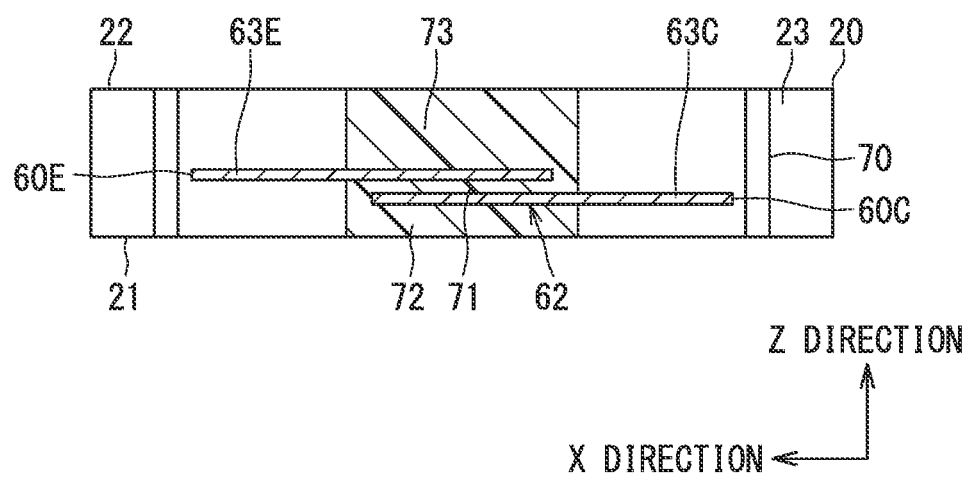
FIG. 17 is a plan view showing a seventh modification and corresponding to FIG. 7.

As in a seventh modification shown in FIG. 17, the thickness of the terminal covering portion 70 may be substantially equal to the thickness of the sealing resin body 20. In this case, the creepage distance between the non-facing portions 63C and 63E can be increased. Specifically, the lengths d1 and d3 in the Z direction described above can be increased. Therefore, since the length d2 in the X direction can be shortened, the occupied area of the facing portion 62 and in turn the main terminal 60 can be reduced.

Figure 18:
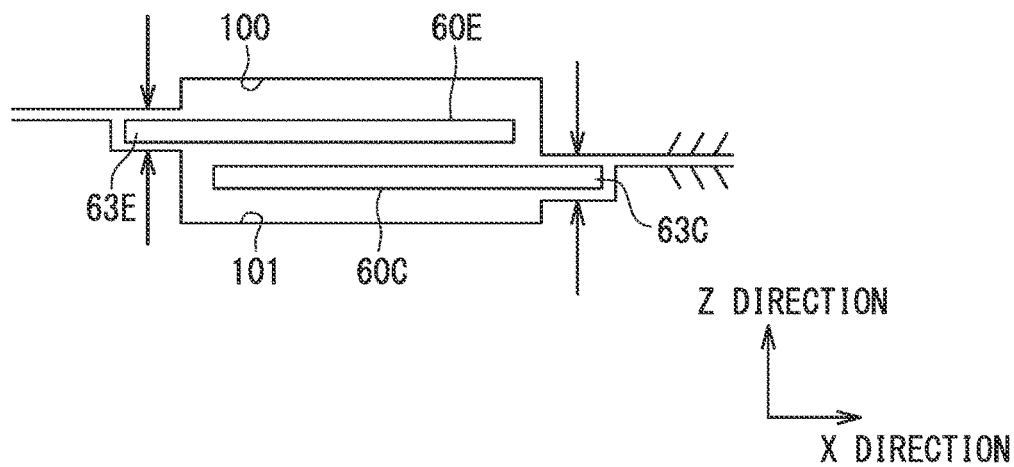
FIG. 18 is a diagram for explaining an effect of molding.

In the present embodiment, the terminal covering portion 70 is molded integrally with the sealing resin body 20. Since the terminal covering portion 70 is formed in the same process as the sealing resin body 20, the manufacturing process can be simplified. In the configuration in which the non-facing portions 63C and 63E are disposed at both ends in the plate width direction as in the example shown in FIG. 5, the non-facing portions 63C and 63E at both ends can be clamped by upper mold 100 and lower mold 101, respectively, as shown in FIG. 18. Thus, the gap of the facing portions 62, that is, the insulation distance can be stabilized.

In the example shown in FIG. 18, the non-facing portion 63C of the collector side main terminal 60C is disposed at a position farther from the heat dissipation surface 42E of the emitter side heat sink 40E in the Z direction than the non-facing portion 63E of the emitter side main terminal 60E. In the same manner, the non-facing portion 63E is disposed at a position farther from the heat dissipation surface 42C of the heat sink 40C than the non-facing portion 63C. Thus, the creepage distance between the heat dissipation surfaces 42C and 42E and the main terminals 60Can be increased.

In the example shown in FIG. 5, the notches 64C and 64E have a substantially arc shape. The notches 74 of the terminal covering portion 70 have a substantially arc shape along the notches 64C and 64E. In such a case, when bus bars (not shown) are connected to exposed portions of the non-facing portions 63C and 63E by arc-shaped connection such as friction stir welding or bolt fastening, a distance from the connection portion to the end portion (notch 74) of the terminal covering portion 70 can be substantially equal over the length of the arc. Thus, it is possible to suppress a local increase in stress at the end of the terminal covering portion 70. For example, the heat transfer distance can be made uniform. The distance from the connection portion to the terminal covering portion 70 is determined in consideration of heat and fastening stress.

Figure 19:
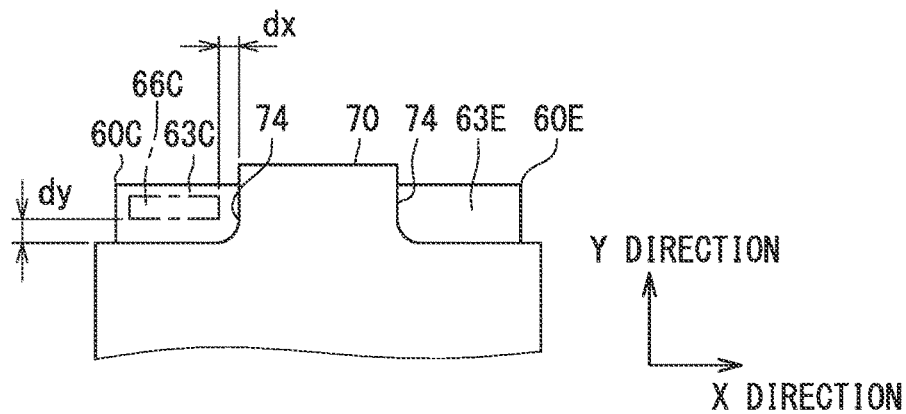
FIG. 19 is a plan view showing an eighth modification.

The planar shape of the exposed portions of the non-facing portions 63C and 63E is not limited to the above example. As in an eighth modification shown in FIG. 19, the exposed portions of the non-facing portions 63C and 63E may have a substantially rectangular planar shape. For example, it is effective when the friction stir welding or laser welding is performed in a line shape. In this case, it is preferable to provide the non-facing portions 63C and 63E so that the distance from the rectangular connecting portion 66C to the end portion (notch 74) of the terminal covering portion 70 is equal. In FIG. 19, the distance dx in the X direction and the distance dy in the Y direction are substantially equal.

Figure 20:
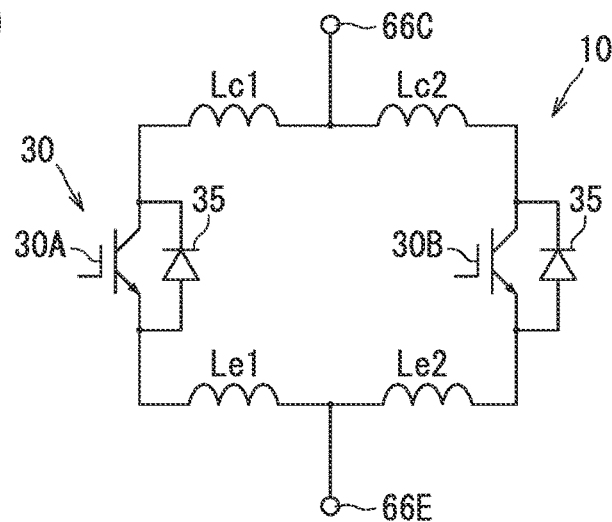
FIG. 20 is an equivalent circuit diagram of the semiconductor device, in consideration of inductance, according to the first embodiment.

FIG. 20 is an equivalent circuit diagram of the semiconductor device 10 considering inductance of the main circuit wiring. Reference numeral 66C denotes a connection portion of a bus bar in the non-facing portion 63C of the main terminal 60C, and reference numeral 66E denotes a connection portion of a bus bar in the non-facing portion 63E of the main terminal 60E. Reference numeral Lc1 denotes an inductance of a wiring between a connection portion 66C and the collector electrode of the IGBT 30A. Reference numeral Lc2 denotes an inductance of a wiring between the connection portion 66C and the collector electrode of the IGBT 30B. Reference numeral Le1 denotes an inductance of a wiring between a connection portion 66E and the emitter electrode of the IGBT 30A. Reference numeral Le2 denotes an inductance of a wiring between the connection portion 66E and the emitter electrode of the IGBT 30B.

Figure 21:
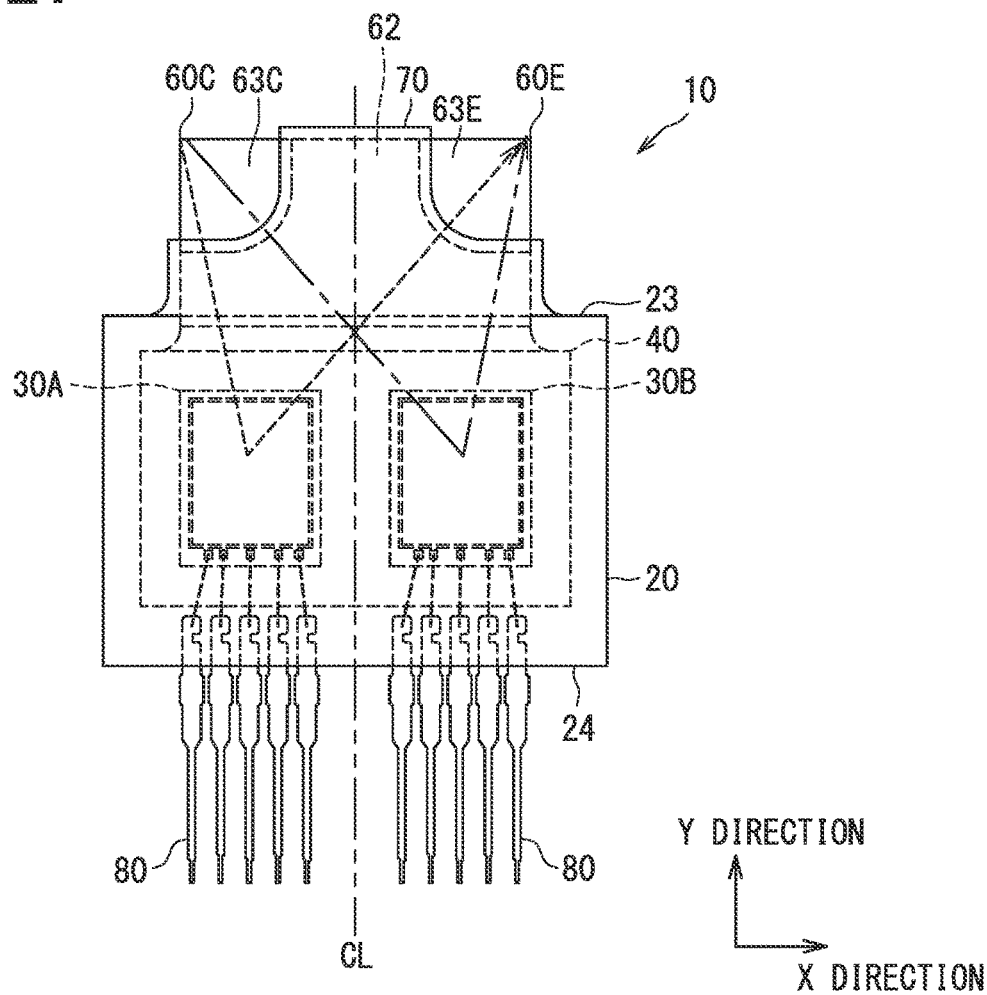
FIG. 21 is a plan view of the semiconductor device for explaining a main current flow.

FIG. 21 shows a flow of the main current in the semiconductor device 10 of the present embodiment. A dashed line arrow indicates a flow of the main current associated with the IGBT 30A, and a one-dot chain line arrow indicates a flow of the main current associated with the IGBT 30B. As described above, in the present embodiment, the IGBTs 30A and 30B are aligned side by side in the X direction, which is the plate width direction of the main terminals 60. The non-facing portions 63C and 63E are arranged in line symmetry with respect to the center line CL of the IGBTs 30. Therefore, the main currents of the IGBTs 30A and 30B flow in line symmetry with respect to the center line CL. In other words, a main circuit inductance (=Lc1+Le1) of the IGBT 30A is substantially equal to a main circuit inductance (=Lc2+Le2) of the IGBT 30B. Thus, since the main circuit inductances are uniform, it is possible to suppress current imbalance when the FWDs 35 are electrically conducting.

Second Embodiment

The present embodiment can refer to the preceding embodiment.

Therefore, the descriptions of the same parts in the semiconductor device 10 shown in the preceding embodiment will be omitted.

Figure 22:
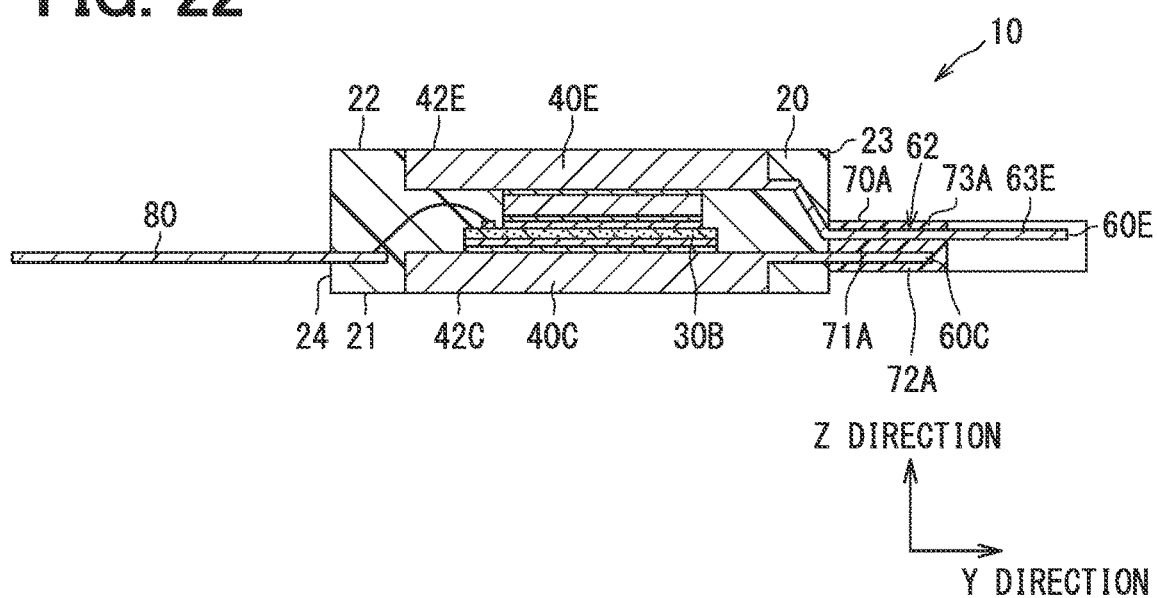
FIG. 22 is a cross-sectional view of a semiconductor device according to a second embodiment, and corresponds to FIG. 9.

As shown in FIG. 22, a semiconductor device 10 according to the present embodiment includes a terminal covering portion 70A. FIG. 22 corresponds to FIG. 9. A basic configuration of the terminal covering portion 70A is the same as that of the terminal covering portion 70 shown in the preceding embodiment. Therefore, elements corresponding to the elements in the preceding embodiment are denoted by adding "A" to the tails of the reference numerals in the present embodiment. The terminal covering portion 70A has an interposed portion 71A and rear surface covering portions 72A and 73A.

The terminal covering portion 70A is formed separately from the sealing resin body 20. The sealing resin body 20 is a primary molded body, and the terminal covering portion 70A is a secondary molded body. The terminal covering portion 70A is formed after molding the sealing resin body 20. The semiconductor device 10 is secondarily sealed. Other structures are similar to those in the precedent embodiment.

Thus, even when the terminal covering portion 70A, which is the secondary molded body, is employed, the same effects as those of the preceding embodiment can be achieved.

The material of the terminal covering portion 70A may be different from that of the sealing resin body 20. When the voltage ranges to be used is high, a material having an insulating property superior to that of the sealing resin body 20 may be used.

Further, a material having Young's modulus smaller than that of the sealing resin body 20 may be used for the terminal covering portion 70A. In this case, when the terminal covering portion 70A is molded, a resin easily flows between the facing surfaces of the main terminals 60C and 60E. Therefore, the facing surfaces of the facing portion 62 of the main terminals 60C and 60E can be brought closer to each other to reduce the inductance.

The configuration of the present embodiment can be combined with any of the configurations of the modifications.

Third Embodiment

The present embodiment can refer to the preceding embodiment. Therefore, the descriptions of the same parts in the semiconductor device 10 shown in the preceding embodiment will be omitted.

In the present embodiment, at least one of the notches 64C and 64E is formed in a plurality. Such a configuration may be employed.

Figure 23:
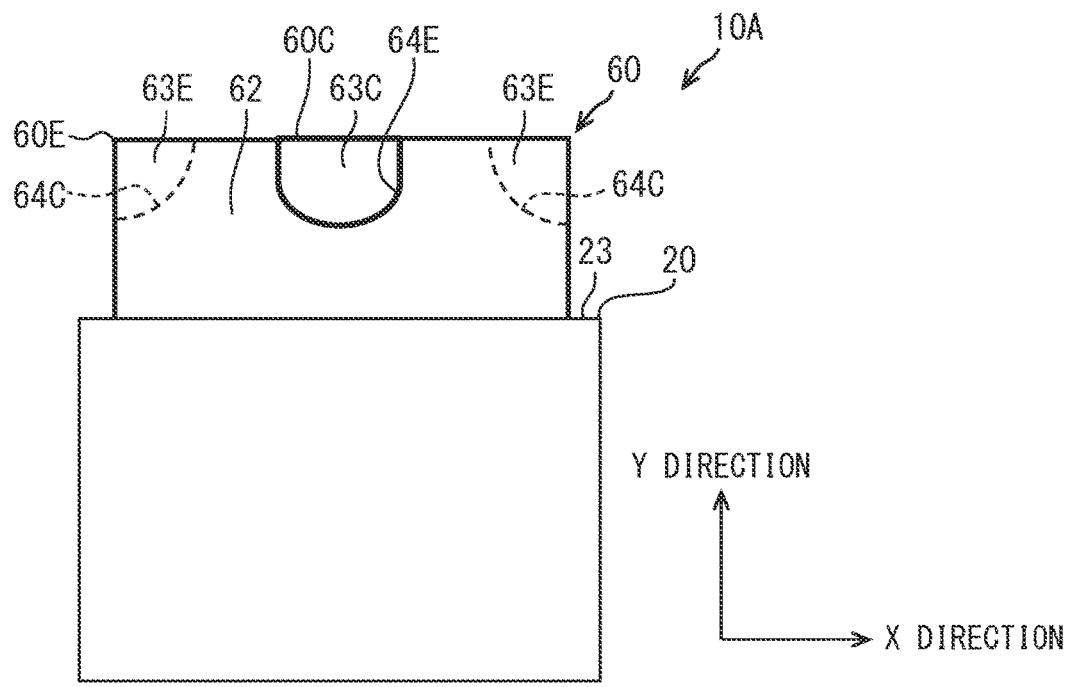
FIG. 23 is a plan view of an upper arm of a semiconductor device according to a third embodiment, and corresponds to FIG. 10.

For example, a semiconductor device 10A shown in FIG. 23 forms the upper arm of the upper and lower arm circuit. The semiconductor device 10A has two notches 64C and one notch 64E. The notches 64C of the main terminal 60C are formed at two positions on the projecting distal end out of the four corners of the substantially rectangular planar shape. The notch 64E of the main terminal 60E is formed in the central portion of the projecting distal end. Other structures are similar to those in the precedent embodiment (e.g., the first embodiment).

Figure 24:
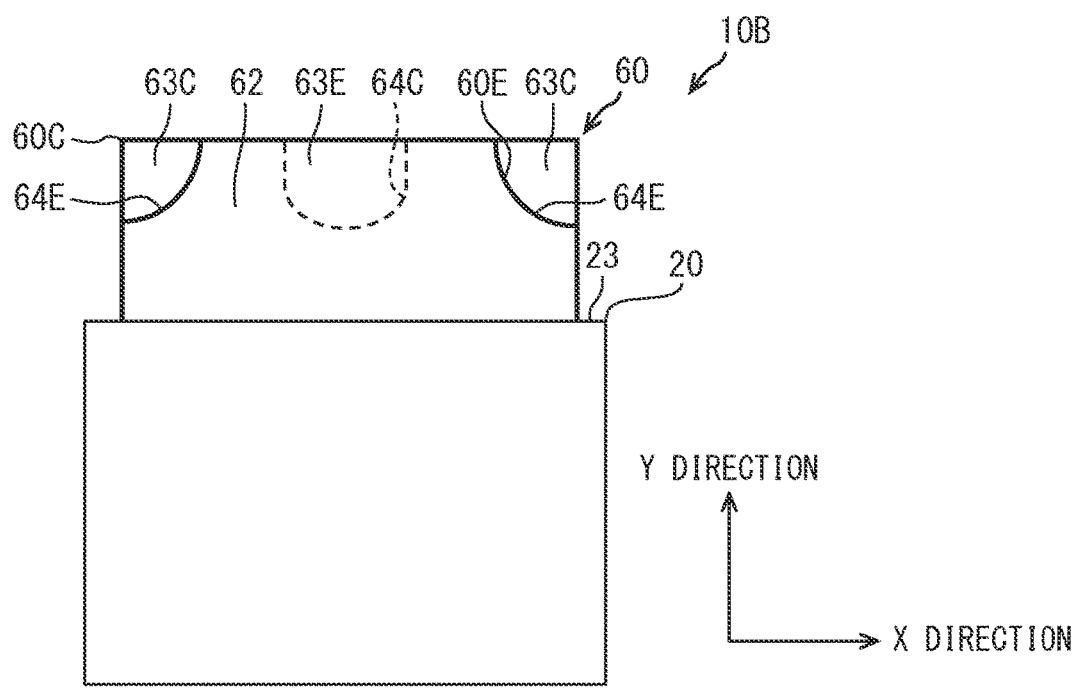
FIG. 24 is a plan view of a lower arm of a semiconductor device according to the third embodiment, and corresponds to FIG. 10.
Figure 25:
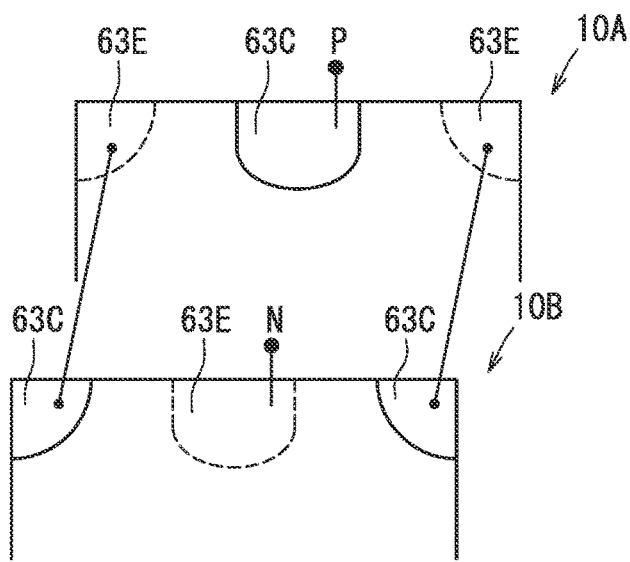
FIG. 25 is a diagram showing a connection state of the upper arm and the lower arm.

A semiconductor device 10B shown in FIG. 24 forms the lower arm of the upper and lower arm circuit. The semiconductor device 10B has two notches 64E and one notch 64C. The notches 64E of the main terminal 60E are formed at two positions on the projecting distal end out of the four corners of the substantially rectangular planar shape. The notch 64C of the main terminal 60C is formed in the central portion of the projecting distal end. Other structures are similar to those in the precedent embodiment (e.g., the first embodiment). The semiconductor devices 10A and 10B have the same structure except that the non-facing portions 63C and 63E and the notches 64C and 64E are different. FIGS. 24 and 25 respectively correspond to FIG. 10. For the convenience, only the sealing resin body 20 and the main terminals 60 are shown in FIGS. 24 and 25.

Then, the upper and lower arm circuit is formed by connecting the semiconductor devices 10A and 10B as shown in FIG. 25. The non-facing portions 63E of the semiconductor device 10A of the upper arm and the non-facing portions 63C of the semiconductor device 10B of the lower arm are connected to each other by bus bars or the like. The non-facing portion 63C of the semiconductor device 10A functions as a P terminal which is a high potential side terminal of the upper and lower arm circuit. The non-facing portion 63E of the semiconductor device 10B functions as an N terminal which is a low potential side terminal of the upper and lower arm circuit. The non-facing portions 63E of the semiconductor device 10A and the non-facing portions 63C of the semiconductor device 10B function as an O terminal which is an output terminal.

The semiconductor devices 10A and 10B are stacked in the Z direction via a cooler. In this stacked structure, the non-facing portions 63E of the semiconductor device 10A and the non-facing portions 63C of the semiconductor device 10B face each other. Therefore, an external connection distance between the non-facing portions 63C and 63E can be shortened. As a result, the inductance of the main circuit can be reduced.

As described above, the inductance can be reduced by forming a plurality of notches, as at least one of the notches 64C and 64E. Also, the degree of freedom of connection can be improved.

The configuration of the present embodiment can also be combined with the configuration of the second embodiment and/or the configurations of the modifications.

Fourth Embodiment

The present embodiment can refer to the preceding embodiment. Therefore, the descriptions of the same parts in the semiconductor device 10 shown in the preceding embodiment will be omitted.

Figure 26:
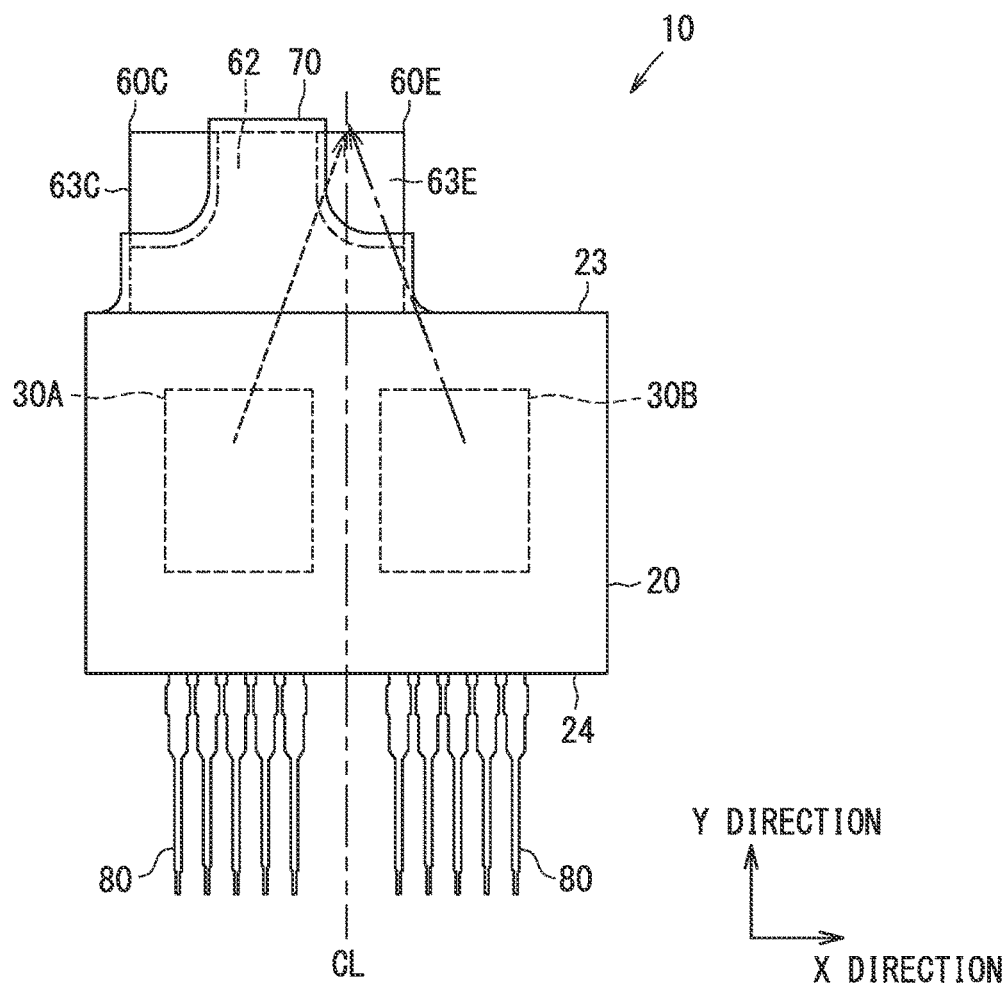
FIG. 26 is a cross-sectional view of a semiconductor device according to a forth embodiment, and corresponds to FIG. 5.

In FIG. 26, a dashed line arrow indicates a flow of the emitter current associated with the IGBT 30A, and a one-dot chain line arrow indicates a flow of the emitter current associated with the IGBT 30B. Also in the present embodiment, the IGBTs 30A and 30B are aligned side by side in the X direction, which is the plate width direction of the main terminals 60. The non-facing portion 63E of the main terminal 60E is arranged on the center line CL of the IGBTs 30. Other structures are similar to those in the precedent embodiment (e.g., the first embodiment). In FIG. 26, for the convenience, only the IGBTs 30 are shown of the portions covered by the sealing resin body 20.

With the above placement, the emitter currents of the IGBTs 30A and 30B flow in line symmetry with respect to the center line CL. In other words, the inductance Le1 of the IGBT 30A and the inductance Le2 of the IGBT 30B are substantially equal. Therefore, the voltage imbalance between a gate voltage Vge of the IGBT 30A and a gate voltage Vge of the IGBT 30B can be suppressed. As a result, a deviation of the on-timing between the IGBTs 30A and 30B can be suppressed, and thus a current imbalance between the IGBTs 30A and 30B during conduction can be suppressed.

The configuration of the present embodiment can also be combined with the configuration of the second embodiment and/or the configurations of the modifications.

Fifth Embodiment

The present embodiment can refer to the preceding embodiment. Therefore, the descriptions of the same parts in the semiconductor device 10 shown in the preceding embodiment will be omitted.

Figure 27:
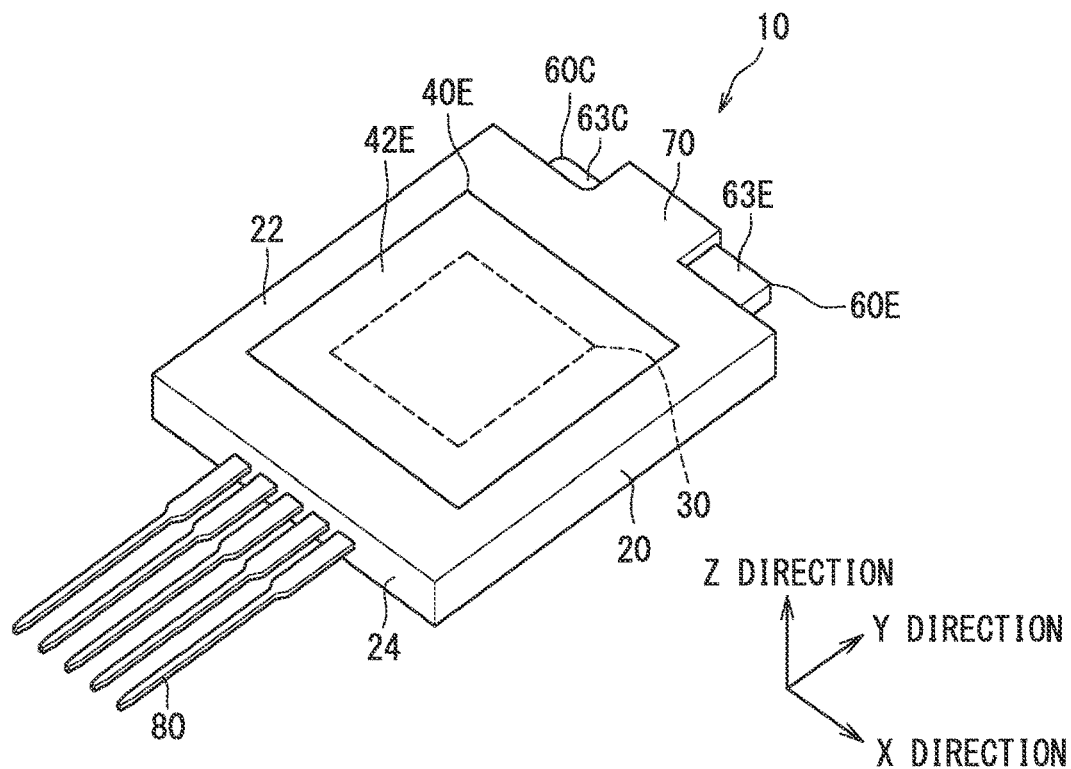
FIG. 27 is a perspective view of a semiconductor device according to a fifth embodiment.

As shown in FIG. 27, a semiconductor device 10 of the present embodiment includes only one IGBT 30. The terminal covering portion 70 shown in FIG. 27 is molded integrally with the sealing resin body 20. The terminal covering portion 70 has substantially the same thickness as the sealing resin body 20. Other structures are similar to those in the precedent embodiment (e.g., the first embodiment). Such the semiconductor device 10 can also achieve the same effects as the preceding embodiments.

The configuration of the present embodiment can also be combined with the configuration of the second embodiment and/or the configurations of the modifications.

Although the present disclosure has been described in accordance with the embodiments, it is understood that the present disclosure is not limited to such embodiments or structures. The present disclosure encompasses various modifications and variations within the scope of equivalents. In addition, various combinations and forms, and other combinations and forms including only one element, more, or less than them are also included in the scope and concept of the present disclosure.

Although examples in which the semiconductor devices 10, 10A, 10B are applied to the inverter 5 have been described, the present disclosure is not limited to the above examples. For example, the present disclosure can be applied to a boost converter. The present disclosure can also be applied to both the inverter 5 and the boost converter.

Although the example in which the IGBT 30 and the FWD 35 are integrally formed has been described, the present disclosure is not limited to the above example. The IGBT 30 and the FWD 35 may be formed on separate chips.

Although the examples in which the semiconductor elements are provided by the IGBTs 30 have been described, the present disclosure is not limited to the above examples. For example, a MOSFET may be employed as the semiconductor element.

Although the semiconductor device having the terminal members 50 has been exemplified as the semiconductor device 10 having a double-sided heat dissipation structure, the present disclosure is not limited to the above example. The terminal member 50 may not be provided. For example, instead of the terminal member 50, the heat sink 40E may be provided with a projection portion projecting toward the emitter electrode 33.

Figure 28:
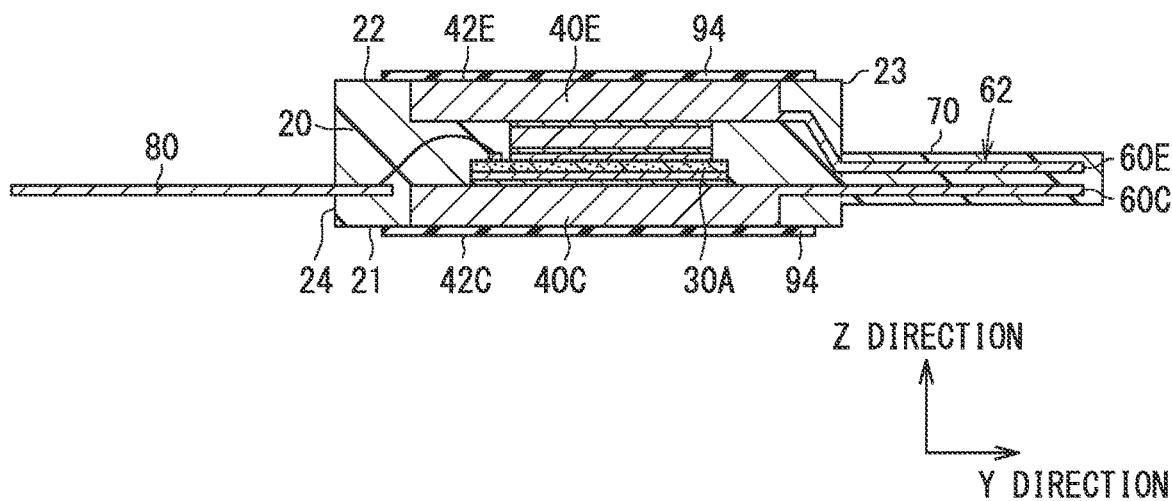
FIG. 28 is a cross-sectional view of a semiconductor device of a ninth modification, and corresponds to FIG. 8.

In addition, the semiconductor device in which the heat dissipation surfaces 42C and 42E are exposed from the sealing resin body 20 has been exemplified. However, the heat dissipation surfaces 42C and 42E may not been exposed from the sealing resin body 20. For example, as in a ninth modification shown in FIG. 28, the heat dissipation surfaces 42C and 42E may be completely covered with an insulating member 94. In FIG. 28, as the insulating member 94, insulating sheets are attached to the heat dissipation surfaces 42C and 42E and the sealing resin body 20. As the insulating sheet, for example, it is possible to employ a sheet made of an organic base material, such as epoxy or silicone, containing a large amount of an inorganic high thermal conductive filler, such as boron nitride (BN). In place of the insulating sheet, an inorganic substrate made of SiN or the like may be employed as the insulating member 94. The sealing resin body 20 may be molded in a state where the insulating members 94 are attached to the heat dissipation surfaces 42C and 42E.

Although the example in which the two IGBTs 30 are connected in parallel has been described, the present disclosure is not limited to the above example. The present disclosure is also applicable to a configuration in which three or more IGBTs 30 are connected in parallel.

Although the example in which the projecting portions 61 of the main terminals 60C and 60E have the flat plate shape has been described, the present disclosure is not limited to the above example. For example, the non-facing portions 63C and 63E may be bent with respect to the facing portions 62. The plate surfaces on the same side of the non-facing portions 63C and 63E may be flush with each other in the Z direction by bending at least one of them. Furthermore, by employing a variant strip, at least one of the non-facing portions 63C and 63E may be thicker than the plate thickness of the facing portion 62 of the main terminal 60 so as to achieve the flush relationship.

It is also possible to employ a configuration having only the interposed portion 71, 71A as the terminal covering portion 70, 70A.

What is claimed is:

1. A semiconductor device comprising:
    a semiconductor element having a first surface and a second surface opposite to the first surface, the semiconductor element including a first main electrode adjacent to the first surface and a second main electrode adjacent to the second surface;
    a plurality of conductive members including a first conductive member and a second conductive member, the first conductive member being disposed adjacent to the first surface of the semiconductor element and connected to the first main electrode, the second conductive member being disposed adjacent to the second surface of the semiconductor element and connected to the second main electrode;
    an insulating member integrally covering and protecting at least a part of each of the first and the second conductive members and the semiconductor element; and
    a plurality of main terminals including a first main terminal and a second main terminal, the first main terminal connecting to the first conductive member, the second main terminal connecting to the second conductive member, wherein
    the first main terminal and the second main terminal, respectively, have a first projecting portion and a second projecting portion projecting outside of the insulating member,
    the first projecting portion and the second projecting portion, respectively, have a first facing portion and a second facing portion at which plate surfaces of the first projecting portion and the second projecting portion face each other across a gap and that are disposed so as to cancel each other magnetic fluxes caused by main currents flowing in the first main terminal and the second main terminal, and
    the first projecting portion and the second projecting portion, respectively, have a first non-facing portion at which the plate surface of the first projecting portion does not face the plate surface of the second projecting portion and a second non-facing portion at which the plate surface of the second projecting portion does not face the plate surface of the first projecting portion, wherein
    the first projecting portion has a first notch at a position corresponding to the second non-facing portion of the second projecting portion, and the second non-facing portion is defined by the first notch, and
    the second projecting portion has a second notch at a position corresponding to the first non-facing portion of the first projecting portion, and the first non-facing portion is defined by the second notch.

2. The semiconductor device according to claim 1, wherein
    the first projecting portion and the second projecting portion project from a same surface of the insulating member and extend in a same extending direction,
    the first projecting portion has the first notch at an end in a plate width direction that is orthogonal to the extending direction, and
    the second projecting portion has the second notch at an end that is opposite to the end of the first projecting portion where the first notch is provided in the plate width direction.

3. The semiconductor device according to claim 2, wherein
    the first projecting portion has the first notch at an end opposite to the insulating member in the extending direction, and
    the second projecting portion has the second notch at an end opposite to the insulating member in the extending direction.

4. The semiconductor device according to claim 2, wherein
    the first non-facing portion of the first main terminal and the second non-facing portion of the second main terminal are arranged in line symmetry with respect to an elemental center line of the semiconductor element in the plate width direction.

5. The semiconductor device according to claim 1, wherein
    the first projecting portion and the second projecting portion project from a same surface of the insulating member and extend in a same extending direction,
    the first projecting portion has the first notch at an end opposite to the insulating member in the extending direction,
    the second projecting portion has the second notch at an end opposite to the insulating member in the extending direction, and
    at least one of the first notch and the second notch includes a plurality of notches.

6. A semiconductor device comprising:
    a semiconductor element having a first surface and a second surface opposite to the first surface, the semiconductor element including a first main electrode adjacent to the first surface and a second main electrode adjacent to the second surface;
    a plurality of conductive members including a first conductive member and a second conductive member, the first conductive member being disposed adjacent to the first surface of the semiconductor element and connected to the first main electrode, the second conductive member being disposed adjacent to the second surface of the semiconductor element and connected to the second main electrode;
    an insulating member integrally covering and protecting at least a part of each of the first and the second conductive members and the semiconductor element; and
    a plurality of main terminals including a first main terminal and a second main terminal, the first main terminal connecting to the first conductive member, the second main terminal connecting to the second conductive member, wherein
    the first main terminal and the second main terminal, respectively, have a first projecting portion and a second projecting portion projecting outside of the insulating member,
    the first projecting portion and the second projecting portion, respectively, have a first facing portion and a second facing portion at which plate surfaces of the first projecting portion and the second projecting portion face each other across a gap and that are disposed so as to cancel each other magnetic fluxes caused by main currents flowing in the first main terminal and the second main terminal, and the first projecting portion and the second projecting portion, respectively, have a first non-facing portion at which the plate surface of the first projecting portion does not face the plate surface of the second projecting portion and a second non-facing portion at which the plate surface of the second projecting portion does not face the plate surface of the first projecting portion, wherein the insulating member is a first resin part, the semiconductor device further comprising:

a second resin part that connects to the first resin part and includes an interposed portion interposed between the first projecting portion and the second projecting portion.

7. The semiconductor device according to claim 6, wherein the second resin part further includes a first covering portion and a second covering portion, the first covering portion covers a surface of the first facing portion opposite to the second facing portion, and the second covering portion covers a surface of the second facing portion opposite to the first facing portion.

8. The semiconductor device according to claim 7, wherein at least one of the first conductive member and the second conductive member has a surface exposed from the first resin part on a side opposite to the semiconductor element, and the second resin part has a thickness smaller than that of the first resin part in the plate thickness direction.

9. The semiconductor device according to claim 6, wherein the first resin part and the second resin part are provided by an integrally molded part.

10. The semiconductor device according to claim 6, wherein the first resin part is a primary molded body, and the second resin part is a secondary molded body.

11. The semiconductor device according to claim 10, wherein the second resin part has Young's modulus smaller than that of the first resin part.

12. The semiconductor device according to claim 1, wherein the first conductive member has a first heat dissipation surface opposite to the semiconductor element, the second conductive member has a second heat dissipation surface opposite to the semiconductor element, the first heat dissipation surface and the second heat dissipation surface are exposed from the insulating member, the first non-facing portion of the first projecting portion is located farther from the second heat dissipation surface than the second non-facing portion of the second projecting portion in a plate thickness direction of the first main terminal, and the second non-facing portion of the second projecting portion is located farther from the first heat dissipation surface than the first non-facing portion of the first projecting portion in the plate thickness direction.

13. The semiconductor device according to claim 4, wherein the semiconductor element includes a plurality of semiconductor elements, the plurality of semiconductor elements are aligned in the plate width direction and connected in parallel to each other between the first conductive member and the second conductive member, and the first non-facing portion and the second non-facing portion are arranged in line symmetry with respect to a center line that passes through an elemental center of the plurality of semiconductor elements and is orthogonal to the plate width direction.

14. The semiconductor device according to claim 4, wherein the semiconductor element includes a plurality of semiconductor elements, the plurality of semiconductor elements are aligned in the plate thickness direction and connected in parallel to each other between the first conductive member and the second conductive member, one of the first and second conductive members has a lower potential than the other, and the non-facing portion of the one is located on a center line that passes through an elemental center of the plurality of semiconductor elements and is orthogonal to the plate width direction.

\* \* \* \* \*